United States Patent
Ito et al.

(10) Patent No.: US 8,373,073 B2
(45) Date of Patent: Feb. 12, 2013

(54) WIRING BOARD AND METHOD FOR MANUFACTURING THE SAME

(75) Inventors: Sotaro Ito, Ogaki (JP); Kenji Sato, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 570 days.

(21) Appl. No.: 12/566,738

(22) Filed: Sep. 25, 2009

(65) Prior Publication Data
US 2010/0300738 A1    Dec. 2, 2010

Related U.S. Application Data

(60) Provisional application No. 61/182,261, filed on May 29, 2009.

(51) Int. Cl.
*H05K 1/16* (2006.01)
(52) U.S. Cl. ...................... 174/260
(58) Field of Classification Search .......... 174/260, 174/259, 261–264; 361/760–766, 782–785, 361/792–795
See application file for complete search history.

(56) References Cited

FOREIGN PATENT DOCUMENTS

| JP | 11-233678 | 8/1999 |
| JP | 2002-009448 | 1/2002 |
| JP | 2002-271032 | 9/2002 |
| JP | 2003-046028 | 2/2003 |
| JP | 2003-298005 | 10/2003 |
| JP | 2003-309243 | 10/2003 |
| JP | 2004-214543 | 7/2004 |
| JP | 2008-243925 | 10/2008 |
| JP | 2008-311508 | 12/2008 |

OTHER PUBLICATIONS

Machine Translation of Japanese Patent Publication No. H11-233678 (Publication Date: Aug. 27, 1999).*
Office Action issued Sep. 21, 2010, in Japanese Patent Application No. 2010-51692 (with English translation).

* cited by examiner

*Primary Examiner* — Jeremy Norris
*Assistant Examiner* — Tremesha S Willis
(74) *Attorney, Agent, or Firm* — Oblon, Spivak, McClelland, Maier & Neustadt, L.L.P.

(57) ABSTRACT

A wiring board has a substrate designating one of the upper and lower surfaces as a first surface and the other as a second surface, a first laminated section laminated on the second-surface side of the substrate, a first external connection terminal and second external connection terminals formed on the first laminated section, and an electronic component arranged inside the substrate and having first pads on the second-surface side. The first pads and first terminal as well as the first pads and second terminals are electrically connected, and the first terminal and second terminals are formed to avoid being directly over the first pads. When the first pads, first terminal and second terminals are projected onto the second surface, the first terminal is positioned to be surrounded by the first pads, and the first pads and first terminal are positioned to be surrounded by the second terminals.

20 Claims, 27 Drawing Sheets

WIRING BOARD AND METHOD FOR MANUFACTURING THE SAME

CROSS-REFERENCE TO RELATED APPLICATIONS

The present application claims the benefits of priority to U.S. Application No. 61/182,261, filed May 29, 2009. The contents of that application are incorporated herein by reference in their entirety.

BACKGROUND OF THE INVENTION

1. Field of the Invention

The present invention is related to a wiring board with a built-in electronic component such as a resistor or capacitor and its manufacturing method.

2. Discussion of the Background

In Japanese Laid-Open Patent Publication 2002-009448, a wiring board with a built-in electronic component is described. In such a wiring board, multiple external connection terminals are formed on the outer layer, and the pads of an electronic component (semiconductor element) are electrically connected to the external connection terminals. Included among such external connection terminals are those which are formed directly over the pads of the electronic component.

Also, in Japanese Laid-Open Patent Publication 2003-046028, a wiring board with a built-in electronic component having multiple external connection terminals on the outer layer is described. In such a wiring board, external connection terminals are formed to avoid being directly over the entire electronic component. The contents of this publication are incorporated herein by reference in their entirety.

SUMMARY OF THE INVENTION

A wiring board according to one aspect of the present invention has the following: a substrate designating one of the upper and lower surfaces as a first surface and the other as a second surface; a first laminated section laminated on the second-surface side of the substrate; a first external connection terminal and multiple second external connection terminals formed on the second-surface side of the substrate by means of the first laminated section; and an electronic component arranged inside the substrate and having multiple first pads on a surface of the second-surface side. In such a wiring board, the first pads and the first external connection terminal as well as the first pads and the second external connection terminals are electrically connected, the first external connection terminal and the second external connection terminals are formed to avoid being directly over the first pads, and when the multiple first pads, the first external connection terminal and the multiple second external connection terminals are projected onto the second surface of the substrate, the first external connection terminal is positioned to be surrounded by the multiple first pads, and the first pads and the first external connection terminal are positioned to be surrounded by the multiple second external connection terminals.

"Arranged inside the substrate" includes cases in which the entire electronic component is completely embedded in the substrate as well as cases in which only a part of the electronic component is arranged in a cavity formed in the substrate. In short, it is sufficient if at least part of the electronic component is arranged inside the substrate.

In addition, being "directly over" means being positioned in the direction to which layers are laminated (the direction along a normal line of a main surface of a wiring board).

According to another aspect of the present invention, for manufacturing a wiring board in which, inside a substrate designating one of the upper and lower surfaces as a first surface and the other as a second surface, an electronic component having multiple first pads on a surface of the second-surface side is arranged, a method includes laminating a first laminated section on the second-surface side of the substrate; and in positions offset from being directly over the multiple first pads on a surface of the second-surface side of the first laminated section, forming a first external connection terminal and multiple second external connection terminals electrically connected to the multiple first pads in such a way that the first external connection terminal is positioned on the outer layer of a region surrounded by the multiple first pads, and that the first pads are positioned on the inner layer of a region surrounded by the plurality of second external connection terminals, and that the first external connection terminal are positioned on the outer layer of a region surrounded by the plurality of second external connection terminals.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
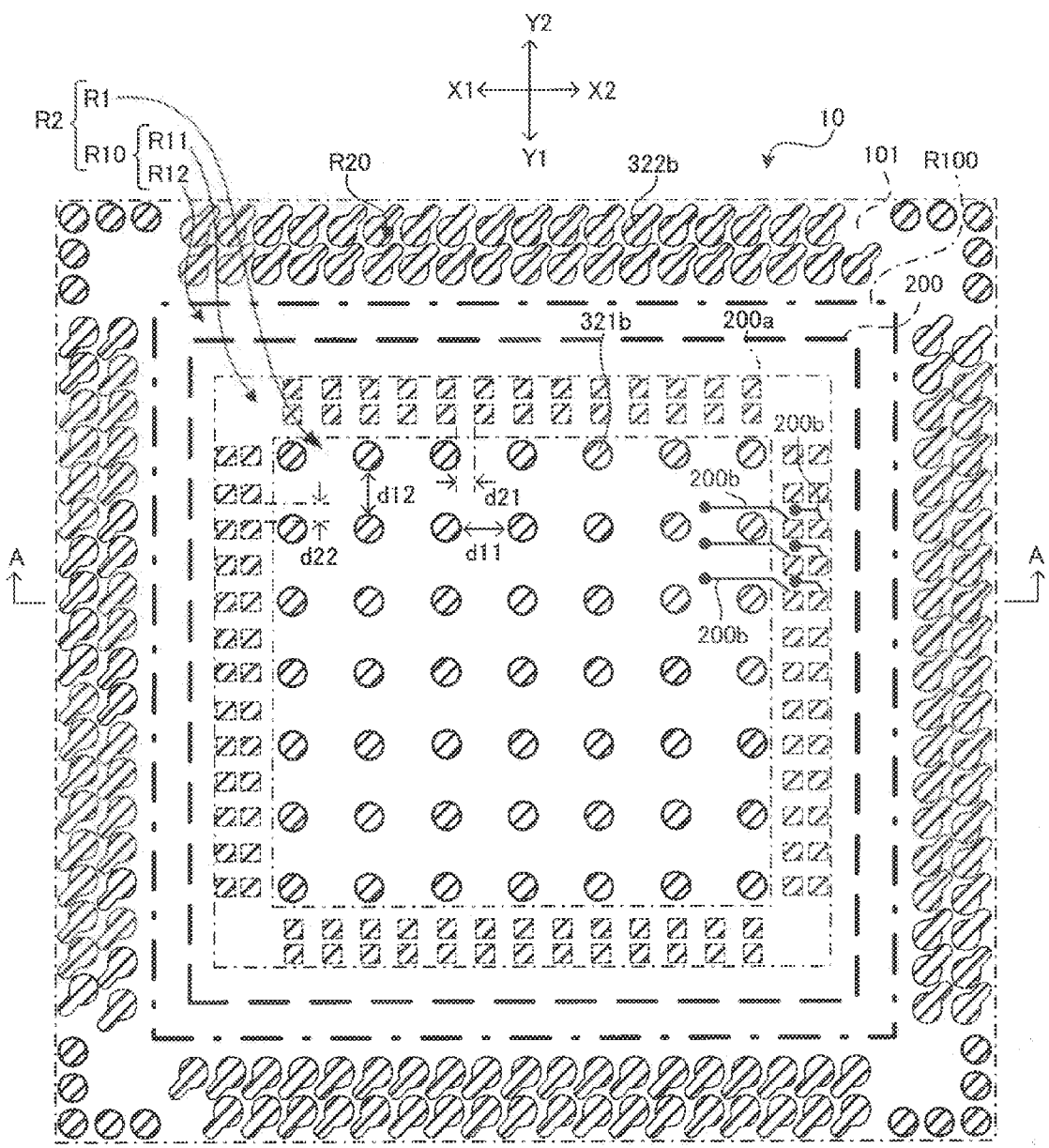
FIG. 1 is a view showing two-dimensional positions of components of a wiring board according to the First Embodiment of the present invention when the components are projected onto the same plane.

The embodiments will now be described with reference to the accompanying drawings, wherein like reference numerals designate corresponding or identical elements throughout the various drawings.

In the following, embodiments of the present invention are described in detail by referring to the drawings. In the drawings, arrows (Z1, Z2) indicate directions to which the layers of a wiring board are laminated, each corresponding to the direction along a normal line (or the direction of the thickness of the core substrate) of their respective main surface (upper or lower surface) of the wiring board. On the other hand, arrows (X1, X2) and (Y1, Y2) indicate directions respectively perpendicular to the lamination directions (directions parallel to the main surfaces of the wiring board).

The main surfaces of the wiring board are on X-Y planes. Hereinafter, the two main surfaces of a wiring board are referred to as a first surface (the surface on the arrow-Z1 side) and a second surface (the surface on the arrow-Z2 side). In addition, in the lamination directions, the side closer to the core (substrate 101) is referred to as a lower layer (or the inner-layer side) and the side away from the core is referred to as an upper layer (or the outer-layer side). Also, an outer layer indicates the uppermost layer, and an inner layer indicates the layer positioned lower than an outer layer.

First Embodiment

FIG. 1 shows the components of wiring board 10 of the present embodiment. Namely, FIG. 1 shows two-dimensional positions of pads (200a) (first pads), external connection terminals (321b) (first external connection terminals) and external connection terminals (322b) (second external connection terminals) when they are projected onto the second surface of substrate 101.

Wiring board 10 of the present embodiment has electronic component 200 built into it as shown in FIG. 1. Electronic component 200 is arranged inside substrate 101. Electronic component 200 has a rectangular external shape. In addition, electronic component 200 has a redistribution layer (extended wiring (200b)) to be electrically connected to pads (200a)). Substrate 101 has space (opening section) (R100) corresponding to the external shape of electronic component 200. Electronic component 200 is arranged in space (R100). Clearance (R12) is formed between substrate 101 and electronic component 200.

Electronic component 200 has pad region (R11) on the periphery. In pad region (R11), multiple pads (200a) are positioned in a lattice pattern with a predetermined distance between each other (such as equidistance). Pads (200a) are arranged in substantially the entire pad region (R11). Inner region (R1) (first region) is arranged inside the area where electronic component 200 is positioned. Inner region (R1) is surrounded by pad region (R11). In inner region (R1), external connection terminals (321b) are positioned in a lattice pattern, for example. Namely, external connection terminals (321b) are surrounded by pads (200a). Pads (200a) are arranged at least on the four sides of inner region (R1). External connection terminals (321b) are lined up equidistantly in the directions of arrows (X1, X2) and in the directions of arrows (Y1, Y2).

Figure 2A:
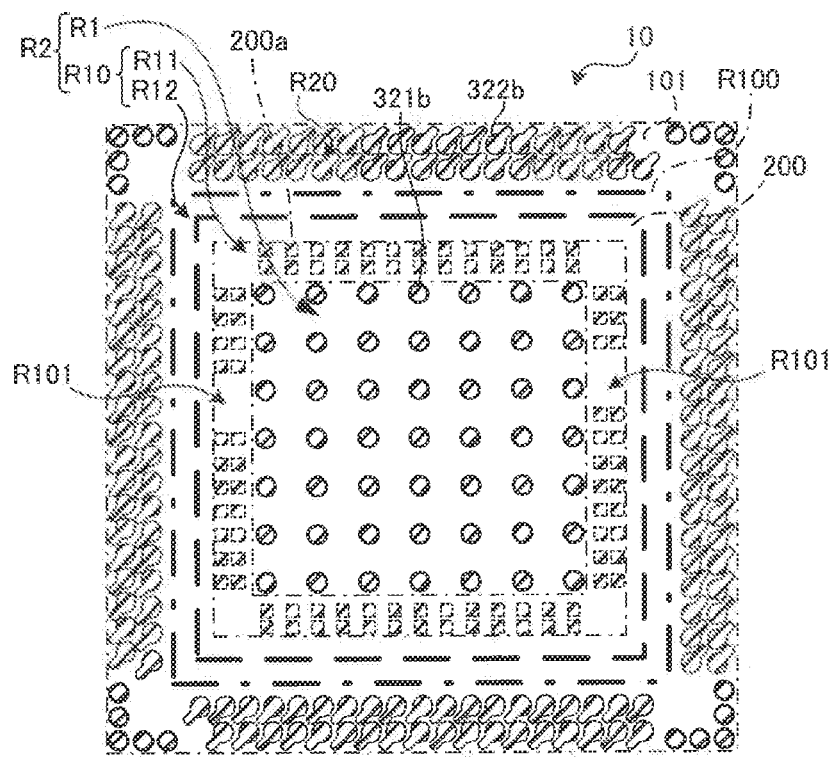
FIG. 2A is a plan view showing an example of a wiring board where pads of an electronic component are omitted in some portions.

On the outer layer of pad region (R11), no external connection terminals (321b) or (322b) are formed. Namely, directly over pads (200a) (in the direction along a normal line of a main surface of wiring board 10), no external connection terminals (321b) or (322b) are formed. Pads (200a) are arranged in substantially the entire pad region (R11); however, as shown in FIG. 2A, for example, some places of pad region (R11) may have portion (R101) where pads (200a) are not arranged. For example, pads (200a) may be omitted in some portions due to situations involving wiring distribution routes or the like.

Regarding the array in the directions of arrows (X1, X2), the minimum pitch (d11) between external connection terminals (321b) (first external connection terminals) is set at twice or more than twice the minimum pitch (d21) between pads (200a) of electronic component 200. Also, regarding the array in the directions of arrows (Y1, Y2), the minimum pitch (d12) between external connection terminals (321b) (first external connection terminals) is set at twice or more than twice the minimum pitch (d22) between pads (200a) (first pads) of electronic component 200. Specifically, the minimum pitches (d11, d12) are set at 100 μm, and the minimum pitches (d21, d22) are set at 50 μm. By setting the pitch of external connection terminals (321b) wider, wiring is fanned out in a preferred way, and it is easier to make alignments when mounting wiring board 10 onto other wiring boards such as a motherboard with a wider pitch. When external connection terminals (321b) or pads (200a) are not arranged equidistantly in a predetermined direction, the narrowest pitch in the array corresponds to the minimum pitch (d11), (d12), (d21) or (d22).

Substrate 101 has external region (R20) near the periphery of space (R100). In external region (R20), multiple external connection terminals (322b) are arranged with a predetermined distance (for example, equidistantly) between them. External connection terminals (322b) are arranged in substantially the entire external region (R20). Namely, in the present embodiment, space (R100) substantially corresponds to second region (R2) surrounded by external connection terminals (322b) (second external connection terminals). Second region (R2) is surrounded by external region (R20) (external connection terminals 322b). External connection terminals (322b) are arranged at least on the four sides of second region (R2), surrounding pads (200a) and external connection terminals (321b). Pads (200a) are arranged on the inner layer of second region (R2), and external connection terminals (321b) are arranged on the outer layer.

Figure 2B:
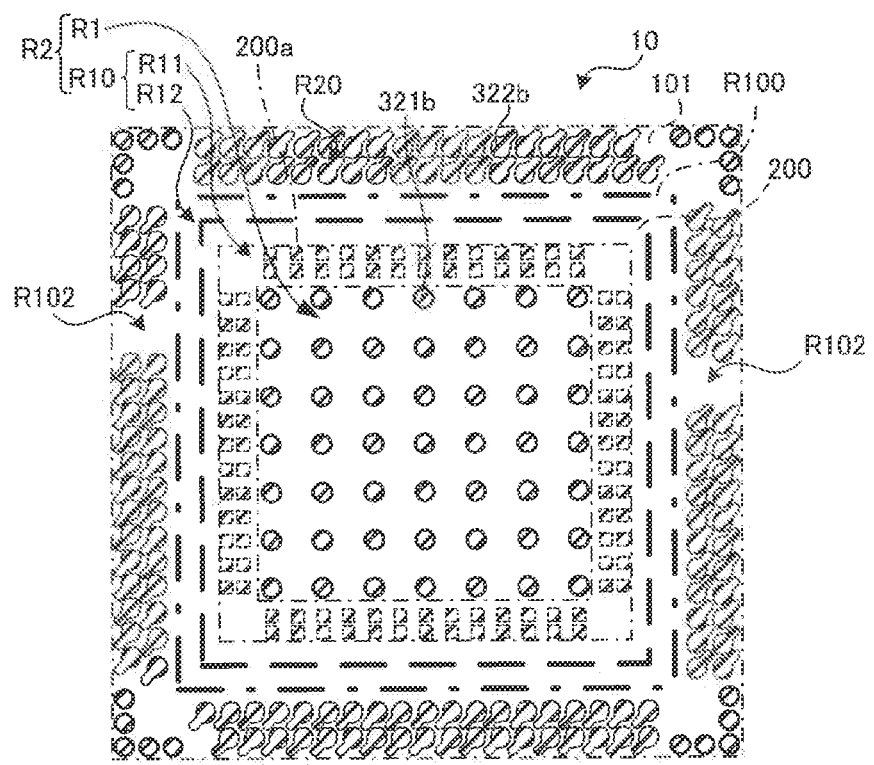
FIG. 2B is a plan view showing an example of a wiring board where second external connection terminals are omitted in some portions.

In the present embodiment, external connection terminals (322b) are arranged substantially in the entire external region (R20). However, as shown in FIG. 2B, for example, some places of external region (R20) may have portion (R102) where external connection terminals (322b) are not arranged. For example, external connection terminals (322b) may be omitted in some portions due to situations involving wiring distribution routes or the like.

No external connection terminals (321b) or (322b) are formed in either pad region (R11) or clearance (R12). Moreover, no external connection terminals (321b) or (322b) are formed in region (R10) (see FIG. 3), which is a contiguous space from the inner boundary of pad region (R11) to the outer boundary of clearance (R12).

In wiring board 10, the following are arranged in this order from the inner side toward the outer side: namely, inner region (R1) (the region where external connection terminals (321b) are formed on the external layer); pad region (R11) (the region where pads (200a) of electronic component 200 are formed on the inner layer and no external connection terminals (321b) or (322b) are formed on the outer layer); and external region (R20) (the region where external connection terminals (322b) are formed on the outer layer).

Figure 3:
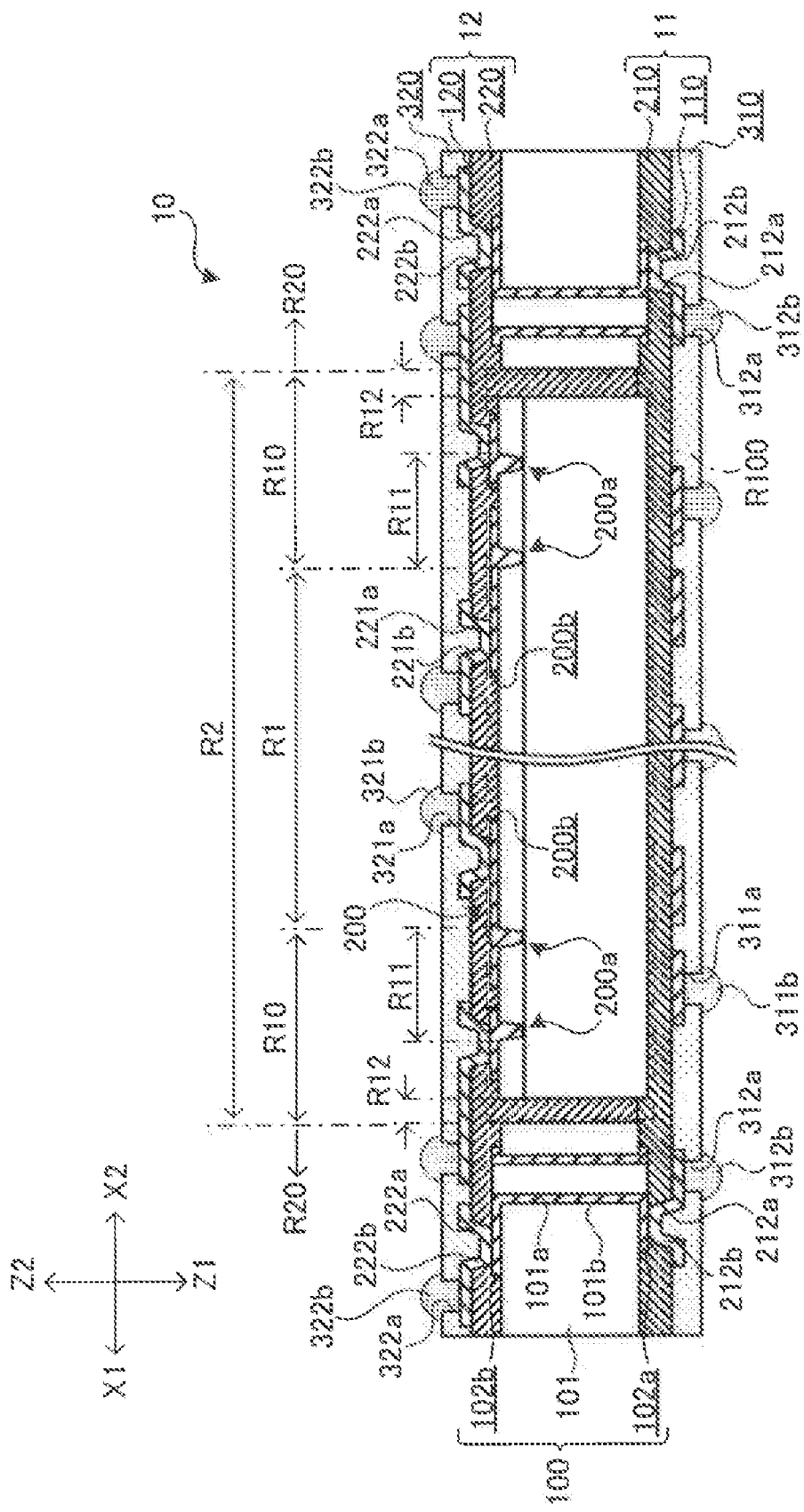
FIG. 3 is a cross-sectional view of FIG. 1 as seen from the A-A line.

As shown in FIG. 3 (a cross-sectional view as seen from the A-A line of FIG. 1), wiring board 10 has wiring board 100, electronic component 200, laminated sections 11, 12 and external connection terminals (311b, 312b, 321b, 322b). Laminated section 11 is formed by laminating insulation layer 210 and wiring layer 110 as a conductive pattern in that order on the first-surface side of substrate 101; and laminated section 12 is formed by laminating insulation layer 220 and wiring layer 120 as a conductive pattern in that order on the second-surface side of substrate 101. As packaging for wiring board 10, for example, a full-grid BGA (ball grid array) is used. However, packaging for wiring board 10 is not limited to such, and any other packaging may also be used.

Wiring board 100 is formed with substrate 101, through-hole (101a), conductive film (101b) and wiring layers (102a, 102b).

Substrate 101 is made of epoxy resin, for example. Epoxy resin is preferred to contain a reinforcing material such as glass fabric or aramid fabric, which is impregnated with resin. Such a reinforcing material has a smaller thermal expansion coefficient than the primary material (epoxy resin). The thickness of substrate 101 is 0.1 mm, for example. The shape, thickness, material, etc. of substrate 101 may be modified according to requirements or the like.

Substrate 101 has through-hole (101a). Conductive film (101b) is formed on the inner wall of through-hole (101a). In addition, substrate 101 has space (R100) configured to correspond to the outer shape of electronic component 200.

Electronic component 200 is arranged in space (R100). Electronic component 200 is, for example, an IC chip with predetermined integrated circuits. Electronic component 200 has multiple pads (200a) formed on its second surface, but no pad is formed on its first surface. Each pad (200a) is made of aluminum, for example. Electronic component 200 also has extended wiring (200b) electrically connected to pads (200a). The surface of extended wiring (200b) is roughened. The IC chip mentioned here includes so-called wafer-level CSP which is produced by forming protective film, terminals or the like on a wafer, further forming redistribution wiring and so forth, then by dicing the wafer into units. Also, electronic component 200 may have pads (200a) on both surfaces (first and second surfaces).

On both surfaces (first and second surfaces) of substrate 101, wiring layers (102a, 102b) are formed respectively. Wiring layer (102a) and wiring layer (102b) are electrically connected by means of conductive film (101b) formed on the inner wall of through-hole (101a).

On the first surface of substrate 101 and of electronic component 200, insulation layer 210 and wiring layer 110 are laminated in that order. Insulation layer 210 is formed to coat the first surface of electronic component 200 and the surface of wiring layer (102a). However, tapered (such as cone-shaped) via hole (212a) to be connected to wiring layer (102a) is formed in a predetermined spot. Conductor (212b) is formed on the wall surface and the bottom of via hole (212a). Via hole (212a) and conductor (212b) form a conformal via, and wiring layer (102a) and wiring layer 110 are electrically connected by such a conformal via.

Meanwhile, on the second surface of substrate 101 and of electronic component 200, insulation layer 220 and wiring layer 120 are laminated in that order. Insulation layer 220 is formed to coat the second surface of electronic component 200, the surface of wiring layer (102b) and the surface of extended wiring (200b). However, on the second-surface side (on the arrow-Z2 side) of electronic component 200, part of insulation layer 220 is removed to form tapered (such as cone-shaped) via hole (221a) to be connected to extended wiring (200b). Moreover, part of insulation layer 220 is removed to form tapered (such as cone-shaped) via hole (222a) to be connected to wiring layer (102b). Conductors (221b, 222b) are formed on the wall surface and bottom of their respective via holes (221a, 222a). Via holes (221a, 222a) and conductors (221b, 222b) form conformal vias, and wiring layer (102b) and wiring layer 120 as well as extended wiring (200b) and wiring layer 120 are electrically connected by such conformal vias.

Electronic component 200 is completely enveloped by insulation layers 210, 220. The boundary portion (clearance R12) between electronic component 200 and substrate 101 is filled with the resin that forms insulation layer 220. Accordingly, electronic component 200 is protected by insulation layers 210, 220 and fixed in a predetermined position.

Each of wiring layer 120 or conductors (221b, 222b) is made of copper-plated film, for example. Therefore, reliability is high in the connected portions of electronic component 200 and wiring layer 120.

Insulation layers 210, 220 are made of cured prepreg, for example. As for such prepreg, for example, the following may be used: base materials such a glass fabric or aramid fabric impregnated with resins such as epoxy resin, polyester resin, bismaleimide triazine resin (BT resin), imide resin (polyimide), phenol resin or allyl polyphenylene ether resin (A-PPE resin). However, the shape, material or the like of wiring layers 110, 120 and insulation layers 210, 220 may be modified according to requirements or the like. For example, metal other than copper may be used as the material for wiring layers 110, 120. Moreover, liquid or film-type thermosetting resins or thermoplastic resins or resin-coated copper foil (RCF) may also be used as the material for insulation layers 210, 220 instead of prepreg. Here, thermosetting resins such as epoxy resin, imide resin (polyimide), BT resin, allyl polyphenylene ether resin or aramid resin may be used. Also, thermoplastic resins such as liquid crystalline polymer (LCP), PEEK resins or PTFE resins (fluororesin) may be used. Such materials are preferred to be selected according to requirements from the viewpoint of insulation, dielectric properties, heat resistance, mechanical characteristics and so forth. In addition, the above resins may contain additives such as curing agents, stabilizers or filler.

On the first surface of insulation layer 210, solder-resist layer 310 with opening portions (311*a*, 312*a*) is formed. Also, on the second surface of insulation layer 220, solder-resist layer 320 with opening portions (321*a*, 322*a*) is formed. Solder-resist layers 310, 320 are each made of resins such as photosensitive resins using acrylic-epoxy resin, thermosetting resins mainly containing epoxy resin or ultraviolet setting resins.

Opening portions (311*a*, 321*a*) are formed respectively on the first-surface side and the second-surface side of electronic component 200. Especially, opening portions (321*a*) on the side of pads (200*a*) are arranged in inner region (R1). On the other hand, opening portions (312*a*, 322*a*) are formed respectively on the first-surface side and the second-surface side of substrate 101. Opening portions (312*a*, 322*a*) are all arranged in external region (R20). Wiring layer 110 is exposed through opening portions (311*a*, 312*a*), and wiring layer 120 is exposed through opening portions (321*a*, 322*a*).

External connection terminals (311*b*, 312*b*, 321*b*, 322*b*) made of solder are formed respectively in opening portions (311*a*, 312*a*, 321*a*, 322*a*). External connection terminals (311*b*, 312*b*) and external connection terminals (321*b*, 322*b*) are electrically connected respectively to wiring layers 110 and 120.

Figure 4A:
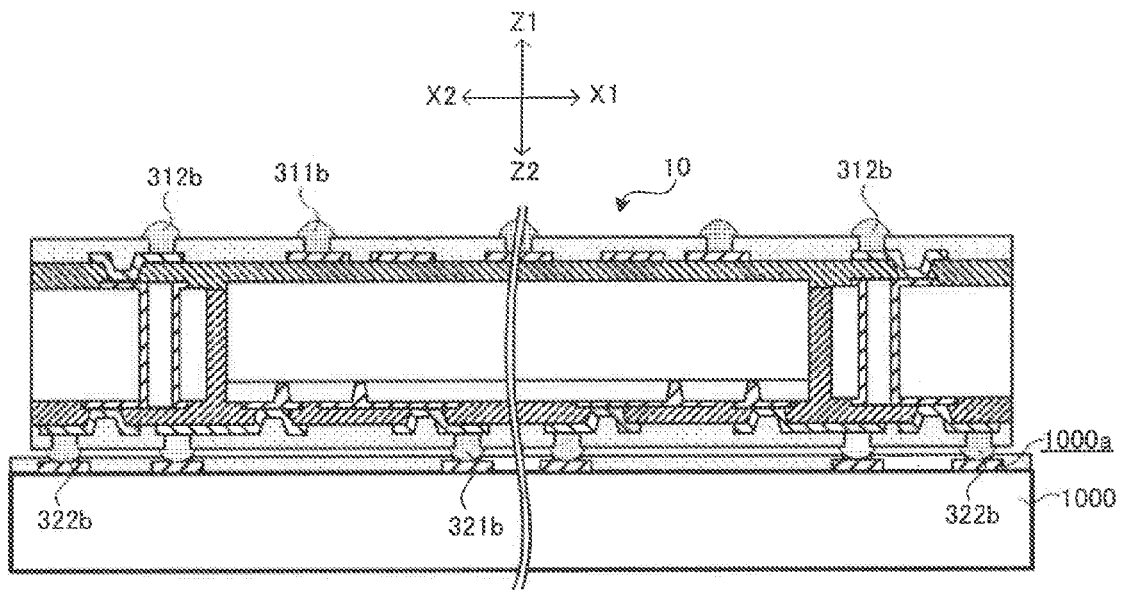
FIG. 4A is a view showing a first example of a wiring board mounted on a motherboard.
Figure 4B:
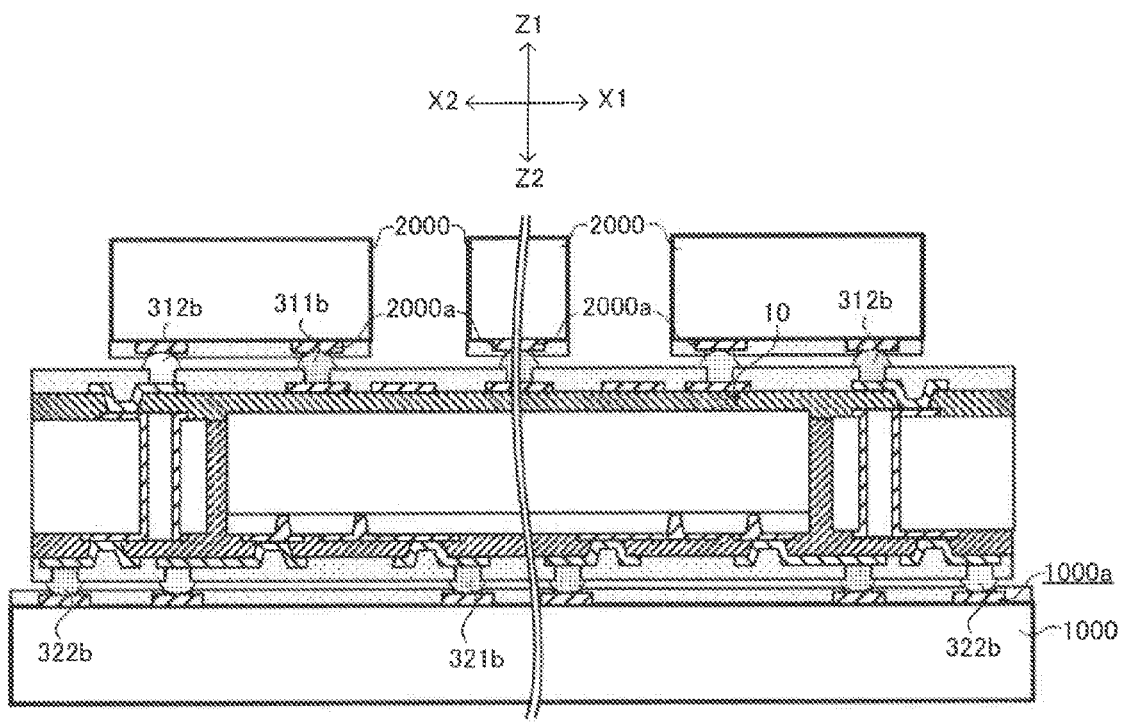
FIG. 4B is a view showing a second example of a wiring board mounted on a motherboard.

External connection terminals (311*b*, 312*b*, 321*b*, 322*b*) are used for electrical connections with other wiring boards or electronic components, for example. Wiring board 10 may be used as a circuit substrate for cell phones or the like when at least one side of wiring board 10 is mounted on another wiring board. For example, as shown in FIG. 4A, wiring board 10 is mounted on electrodes (1000*a*) formed on another wiring board 1000 by means of external connection terminals (321*b*, 322*b*) on the second-surface side (on the side of pads (200*a*)). Other wiring board 1000 is a motherboard, for example. Alternatively, as shown in FIG. 4B, wiring board 10 is mounted on other wiring board 1000 on the second-surface side while external connection terminals (311*b*, 312*b*) on the first-surface side are electrically connected to electrodes (2000*a*) on another wiring board 2000. Accordingly, a stacked structure is formed. Other wiring board 1000 is a motherboard, for example, and another wiring board 2000 is a package substrate with a mounted memory chip, for example.

By connecting wiring board 10 to other wiring board 1000 or 2000, stresses caused by differences in their properties may arise. Such stresses act on connection interfaces between other wiring board 1000 or 2000 and external connection terminals (321*b*, 322*b*) or (311*b*, 312*b*) in directions to separate them (in the direction of arrow-X1 or arrow-X2). Such stresses increase their forces as the temperature rises. Furthermore, as wiring board 10 or its package becomes thinner (reduced number of layers), such stresses tend to be conveyed to electronic component 200. When greater forces are exerted on electronic component 200, quality degradation becomes a concern in electronic component 200. For that matter, since external connection terminals (321*b*, 322*b*) are not formed directly over pads (200*a*) of electronic component 200 (in the direction along a normal line of a main surface of wiring board 10) in wiring board 10 of the present embodiment, stress propagation routes (F1) (FIG. 5A) from other wiring board 1000 to pads (200*a*) become complicated compared with propagation routes (F2) (FIG. 5B) in which external connection terminals (321*b*, 322*b*) are formed directly over pads (200*a*). Therefore, stresses are suppressed from being conveyed to electronic component 200. Accordingly, reliability may be enhanced in the electrical connection of pads (200*a*) and others.

Such a structure of wiring board 10 is especially effective if employed when electronic component 200 containing material with low strength and a low dielectric constant (Low-k) is built into the board, for example.

Wiring board 10 may be mounted on any other wiring board. Also, wiring board 10 may be used without being mounted on other wiring boards.

Figure 6:
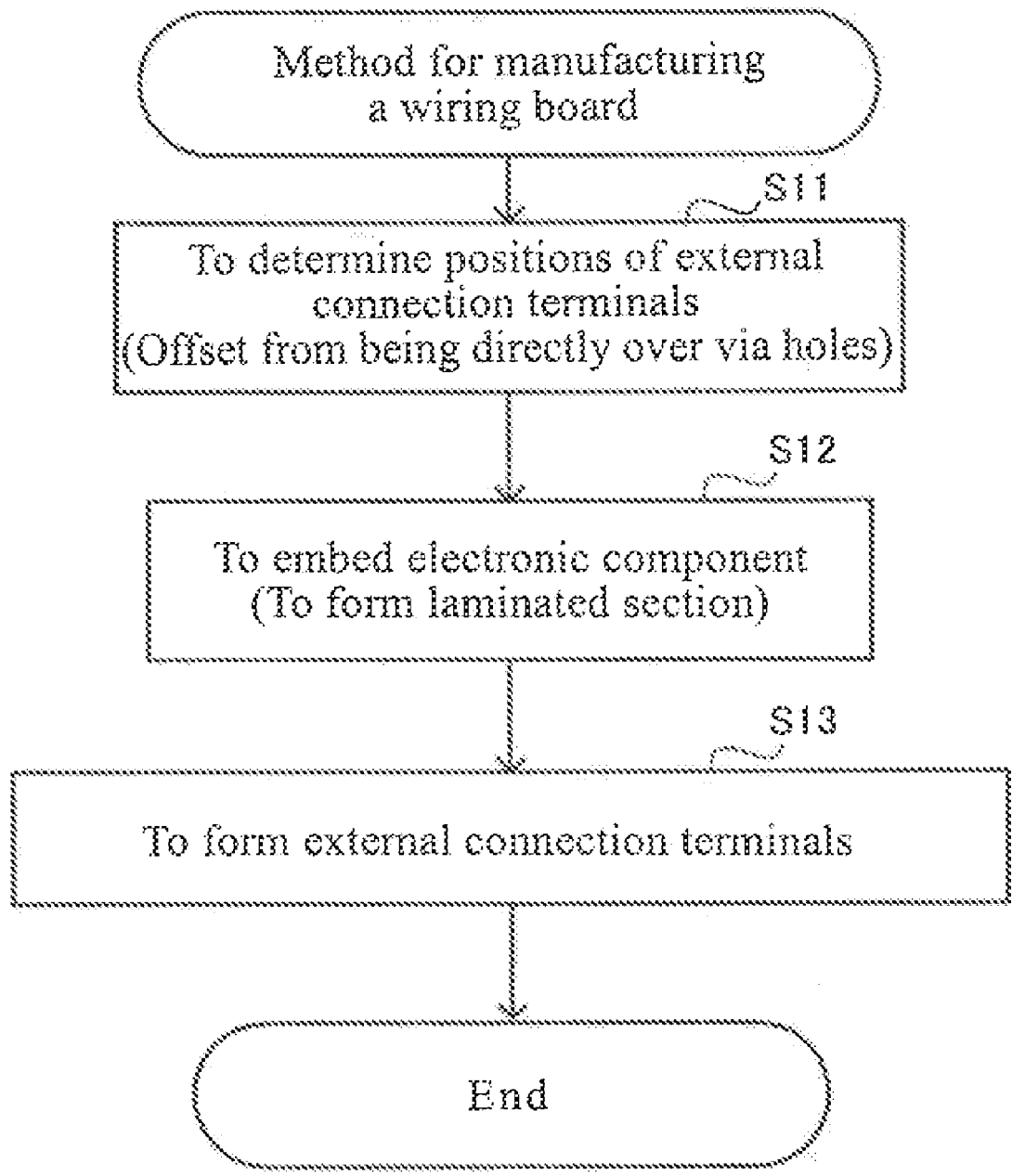
FIG. 6 is a flowchart showing the steps of a method for manufacturing a wiring board according to the First Embodiment.

When manufacturing wiring board 10, for example, a series of processes shown in FIG. 6 are carried out.

The positions of external connection terminals (321*b*, 322*b*) and others are determined in step (S11). External connection terminals (321*b*, 322*b*) are arranged by being shifted (offset) in the directions of arrows (X1, X2) a predetermined distance (offset amount) from their respective spots directly over pads (200*a*) (in the directions of arrows (Z1, Z2)) of electronic component 200. In doing so, stresses exerted on pads (200*a*) may be effectively mitigated. Such an offset amount (distance between external connection terminals (321*b*, 322*b*) and pads (200*a*) of electronic component 200) may be set at any value. However, when seen from the directions of arrows (Z1, Z2), the connection portions of external connection terminals (321*b*, 322*b*) (opening portions (321*a*, 322*a*)) will be arranged so as not to overlap pads (200*a*) (such as aluminum pads) of electronic component 200 (for details, see FIGS. 14A, 15A, 16A, 17A, 18A) described later).

At step (S12), laminated sections (11, 12) are formed through the steps, for example, shown in FIGS. 7A-8D.

Figure 7A:
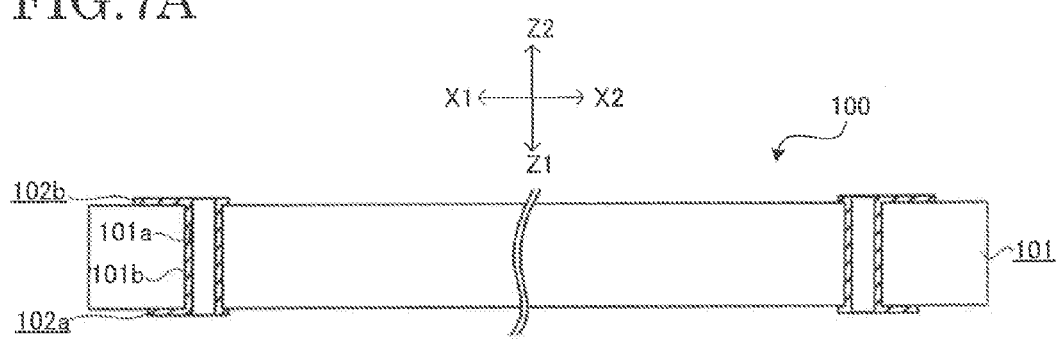
FIGS. 7A-7D are views illustrating steps to arrange an electronic component on a carrier.

For example, wiring board 100 is prepared as shown in FIG. 7A, for example. Wiring board 100 is formed with substrate 101, through-hole (101*a*), conductive film (101*b*) and wiring layers (102*a*, 102*b*). Wiring board 100 corresponds to a core substrate of wiring board 10.

Figure 7B:
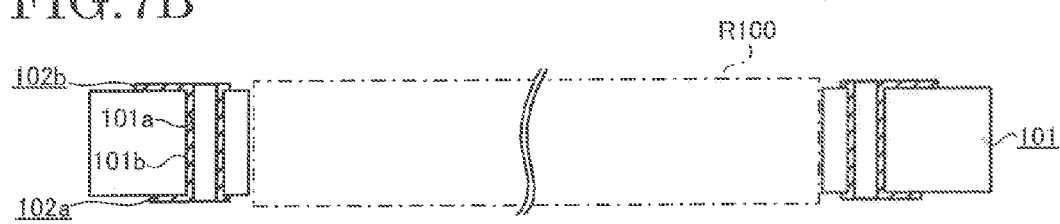

As shown in FIG. 7B, for example, space (R100) is formed in substrate 101 by drilling a hole using a laser, for example.

Figure 7C:
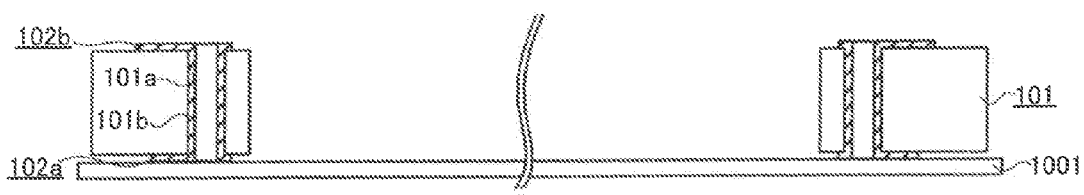

As shown in FIG. 7C, for example, carrier 1001 made of, for example, PET (polyethylene terephthalate) is arranged on one surface (such as the first surface) of substrate 101. Carrier 1001 is laminated and adhered to substrate 101, for example.

Figure 7D:
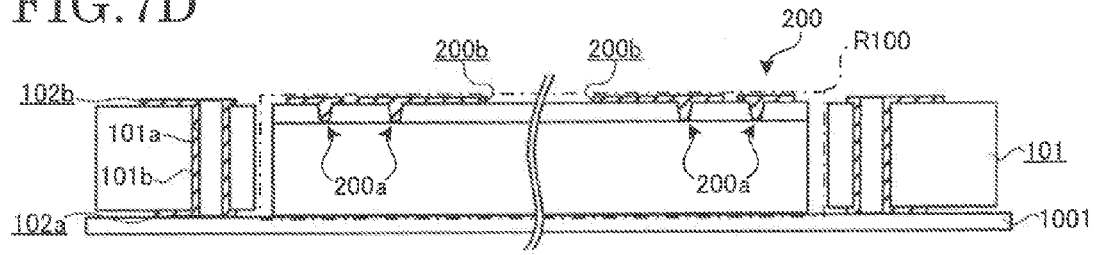

As shown in FIG. 7D, electronic component 200 is mounted onto carrier 1001 (specifically, in space (R100) at room temperature in such a way that pads (200*a*) of electronic component 200 face the second-surface side (the side opposite carrier 1001). On the second surface of electronic component 200, pads (200a) and extended wiring (200b) electrically connected to pads (200a) are formed. The surface of wiring (200b) extended from pads (200a) is roughened. The surface of extended wiring (200b) is usually roughened when extended wiring (200b) is formed. However, according to requirements, the surface of extended wiring (200b) may be roughened using chemicals or the like after the wiring is formed.

Figure 8A:
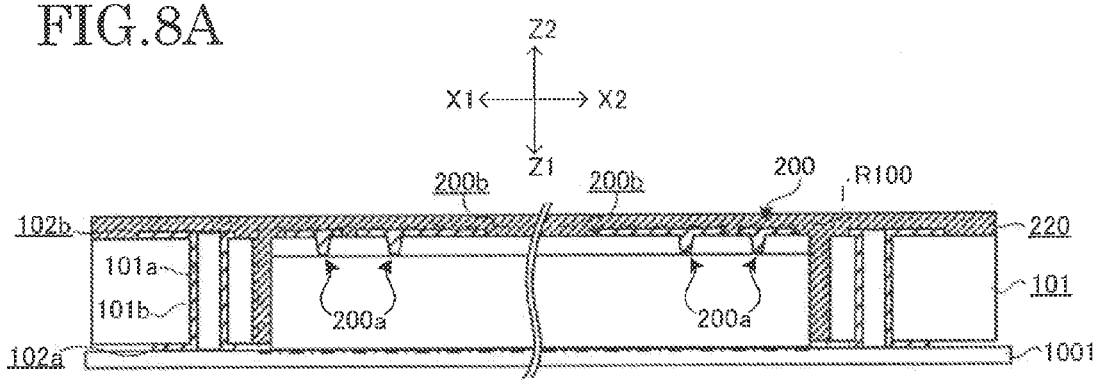
FIGS. 8A-8D are views illustrating steps to form a laminated section.

As shown in FIG. 8A, insulation layer 220 is formed by vacuum lamination so that the layer coats electronic component 200 and the main surface of substrate 101. In doing so, pads (200a) are coated with insulation layer 220. Moreover, insulation layer 220 is melted by heat and fills space (R100). Namely, clearance (R12) between electronic component 200 and substrate 101 is filled with resin that forms insulation layer 220. Accordingly, electronic component 200 is fixed in a predetermined position.

Figure 8B:
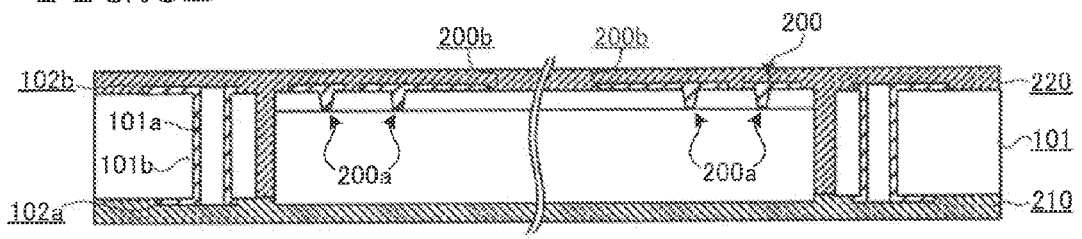

Carrier 1001 is removed by peeling it from the first surface (the surface opposite insulation layer 220) of substrate 101. As shown in FIG. 8B, for example, insulation layer 210 is formed on the second surface of substrate 101. By doing so, electronic component 200 is embedded in substrate 101.

Figure 8C:
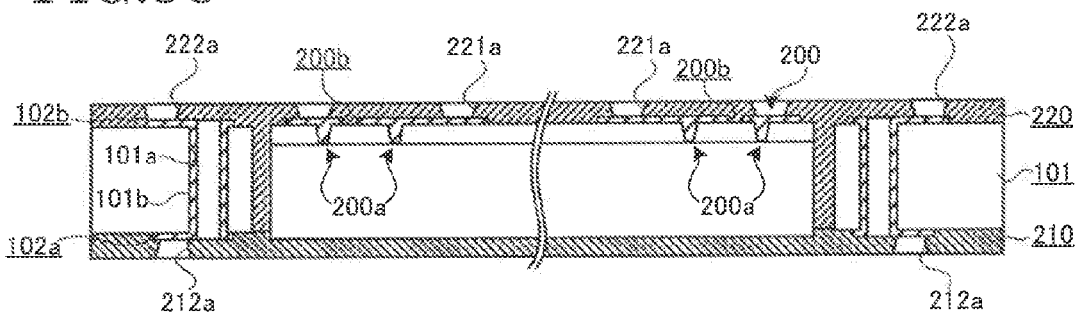

As shown in FIG. 8C, tapered (such as cone-shaped) via holes (212a, 221a, 222a) are formed in insulation layers 210, 220 using a laser or the like.

Figure 8D:
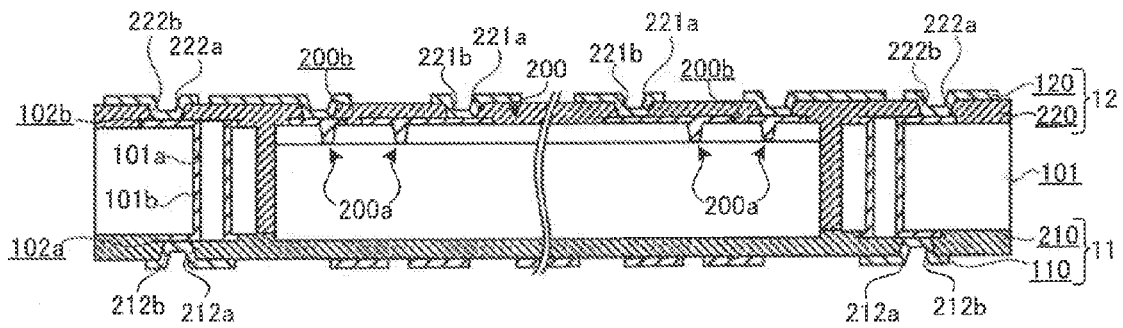

Conductive patterns are formed using a semi-additive method, for example. More specifically, each surface (first surface, second surface) is coated with a patterned plating resist, and electroplating is selectively performed on portions where such resist is not formed. As shown in FIG. 8D, wiring layer 110 and conductor (212b) are formed on the first surface of insulation layer 210, and wiring layer 120 and conductors (221b, 222b) are formed on the second surface of insulation layer 220. Wiring layers 110, 120 are each extended to be away from the spots directly over pads (200a) (in the direction along a normal line of a main surface of wiring board 10). Instead of a semi-additive method, a subtractive method (a method of patterning by etching) may also be used to form wiring layers 110, 120 and conductors (212b, 221b, 222b). Then, insulation layer 210 and wiring layer 110 become laminated section 11; and insulation layer 220 and wiring layer 120 become laminated section 12.

Figure 9:
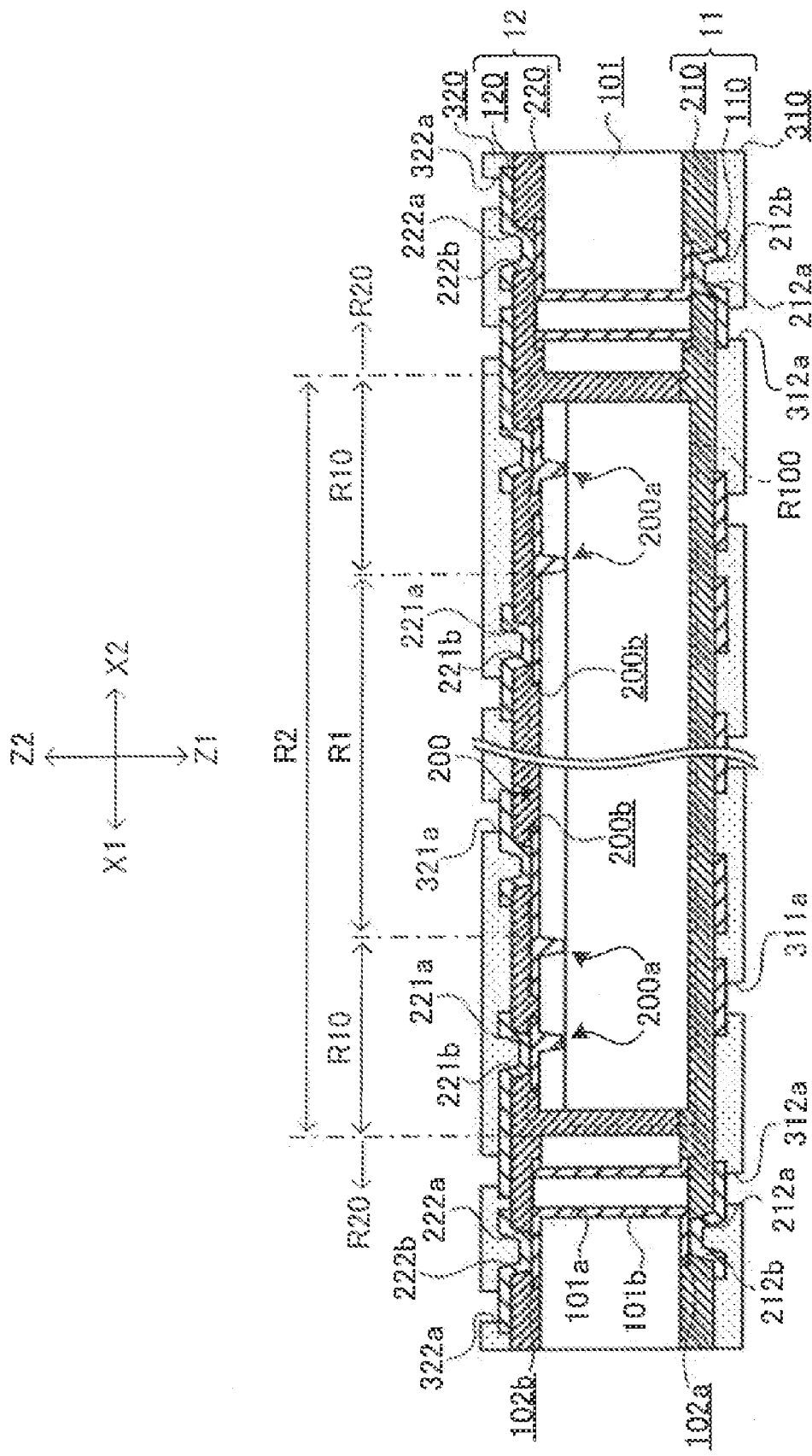
FIG. 9 is a view illustrating a step to form a first external connection terminal and a second external connection terminal.

At step (S13) in FIG. 6, external connection terminals (311b, 312b, 321b, 322b) are formed through the process shown in FIG. 9, for example. More specifically, the worker forms solder-resist layers 310, 320 with a predetermined pattern using methods such as screen printing, spray coating or roll coating. As shown in FIG. 9, in solder-resist layer 310, opening portions (311a, 312a) are formed; and in solder-resist layer 320, opening portions (321a, 322a) are formed. In opening portions (311a, 312a) and opening portions (321a, 322a), wiring layers 110, 120 are exposed respectively.

External connection terminals (311b, 312b, 321b, 322b) are formed in opening portions (311a, 312a, 321a, 322a) respectively. External connection terminals such as (311b) are formed by coating solder paste on wiring layers 110, 120 exposed through opening portions such as (311a), and then by curing them through a heat treatment such as reflowing. External connection terminals (311b, 312b) and external connection terminals (321b, 322b) are electrically connected to wiring layers 110, 120 respectively.

Through the above procedures, wiring board 10 is obtained as shown in FIG. 1 previously.

According to wiring board 10 of the present embodiment, quality degradation due to stresses caused by thermal changes or external forces may be suppressed in electronic component 200 or the like. Electronic component 200 with high wiring density may be mounted without resulting in larger-type wiring board 10 and a subsequent decrease in connection reliability.

Specifically, spots directly over pads (200a) of electronic component 200 (in the direction along a normal line of a main surface of wiring board 10) usually tend to generate heat. Accordingly, if external connection terminals (321b) or (322b) are formed directly over pads (200a) as in a wiring board described in above mentioned Japanese Laid-Open Patent Application 2002-009448, thermal stresses caused by the different thermal expansion coefficients in electronic component 200 and laminated section 12 may likely concentrate around external connection terminals (321b) or (322b). Thus, there is a concern that connection reliability may be reduced. On the other hand, if external connection terminals are formed to avoid being directly over the entire electronic component as in a wiring board described in Japanese Laid-Open Patent Application 2003-046028, and if the pitch of pads (200a) of electronic component 200 is narrow or the number of I/O (input/output) connections of electronic component 200 is large, it may be difficult to mount electronic component 200. Even if an electronic component is mounted, since space (R100) to accommodate electronic component 200 is expanded to the outside, the size of wiring board 10 may increase, or since the wiring length increases, signal transmission delays may arise.

For that matter, as shown in FIG. 1, in wiring board 10 of the present embodiment, external connection terminals (321b, 322b) (first external connection terminals, second external connection terminals) are formed to avoid being directly over pads (200a) (first pads) which tend to generate heat. However, forming the external connection terminals does not mean to avoid being directly over entire electronic component 200; inside the area where electronic component 200 is positioned, there is a space secured for external connection terminals (321b) (first external connection terminals) to be formed while avoiding being directly over pads (200a). Also, outside electronic component 200, external connection terminals (322b) (second external connection terminals) are formed. Therefore, fine pitch electronic component 200 or electronic component 200 with a large number of I/O connections may be mounted without resulting in a larger size in wiring board 10 and a subsequent decrease in connection reliability.

Also, since resin that forms insulation layer 220 is filled in clearance (R12) between electronic component 200 and substrate 101, it is difficult to ensure the flatness of the second surface of wiring board 10 in areas directly over clearance (R12) (in the direction along a normal line of a main surface of wiring board 10). However, in wiring board 10, external connection terminals (321b, 322b) are formed to avoid being directly over pads (200a) of electronic component 200 as well as being directly over clearance (R12) between substrate 101 and electronic component 200 in space (R100). Thus, even higher reliability may be achieved in the electrical connection of pads (200a) or the like.

Figure 5A:
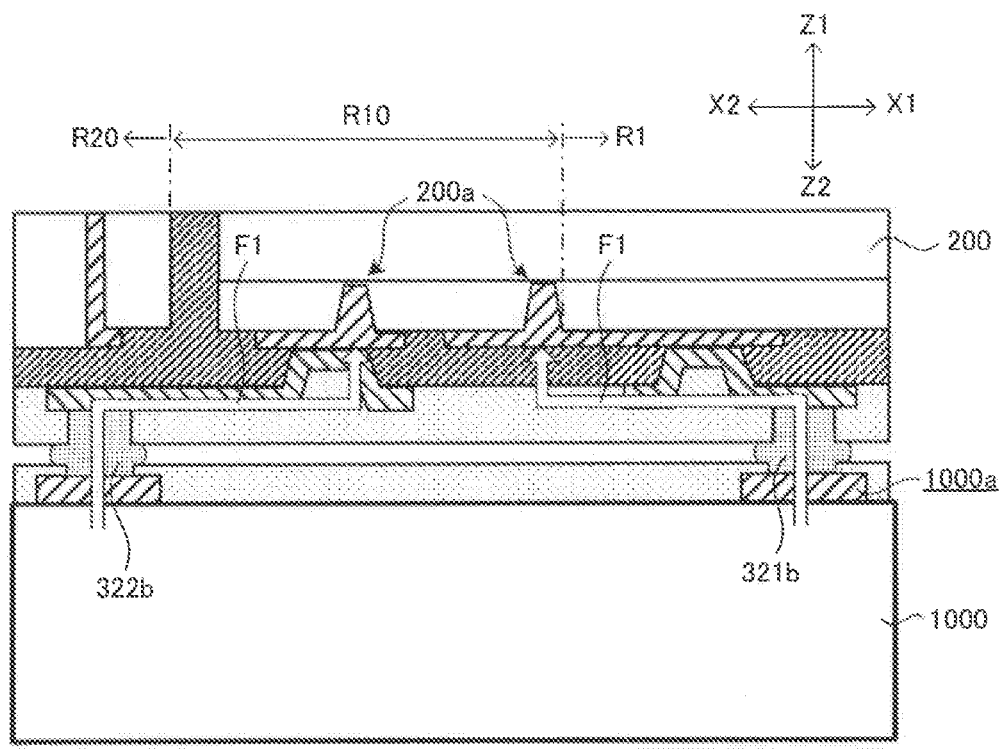
FIG. 5A is a magnified view showing part of FIG. 4A or FIG. 4B.
Figure 5B:
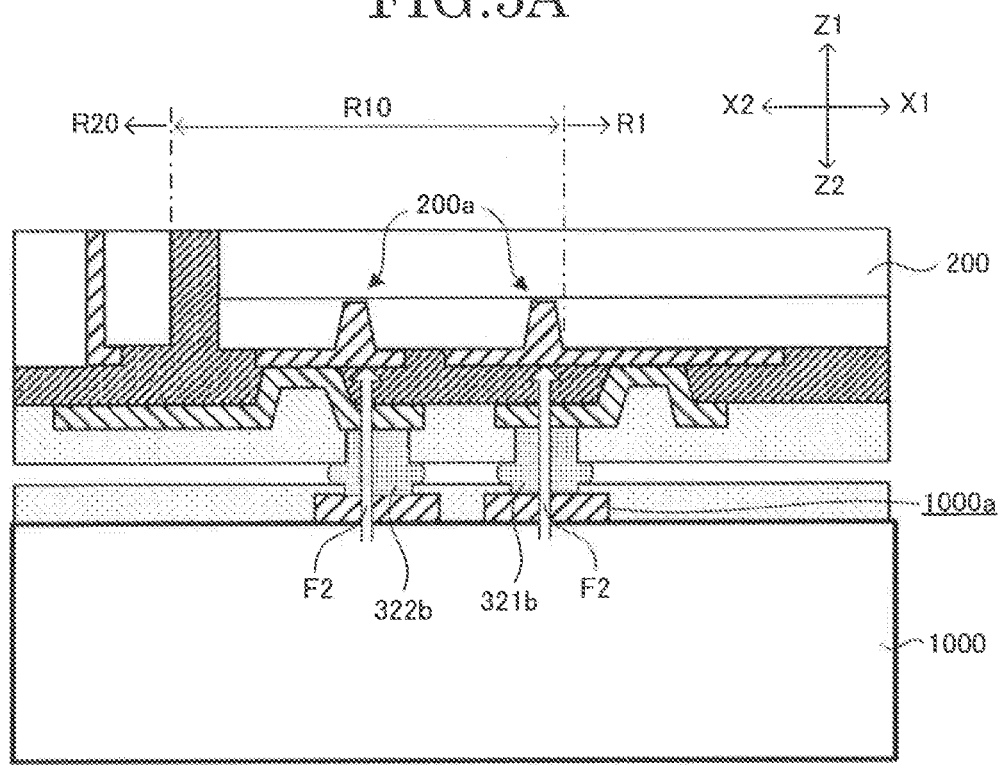
FIG. 5B is a view showing the stresses exerted on a wiring board according to a comparative example.

As shown in FIGS. 5A and 5B, stresses may also be mitigated when wiring board 10 is mounted on other wiring boards 1000, 2000.

Second Embodiment

A wiring board and its manufacturing method according to the Second Embodiment of the present invention is described by focusing on the differences from the above First Embodiment. Here, elements the same as above shown in FIG. 3 or the like are referred to with the same numerical references, and the common portions already described earlier, namely portions whose descriptions would be redundant, are omitted from being described here for the purpose of convenience.

Figure 10:
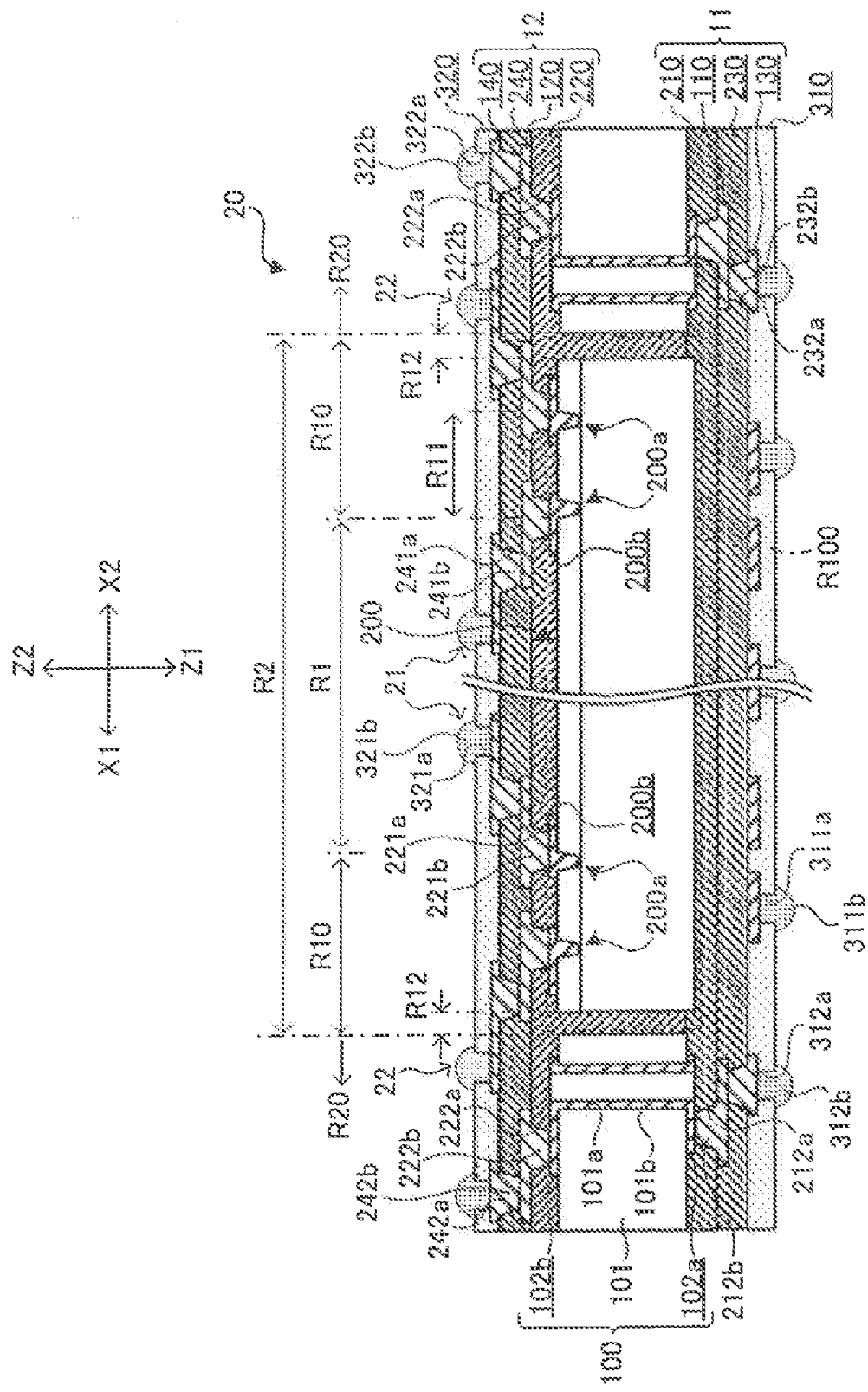
FIG. 10 is a cross-sectional view showing a wiring board according to the Second Embodiment of the present invention.

As shown in FIG. 10 (a cross-sectional view corresponding to FIG. 3), in wiring board 20 of the present embodiment, laminated sections 11, 12 include multiple interlayer insulation layers and multiple conductive layers. More specifically, laminated section 11 is formed with insulation layer 210, wiring layer 110, insulation layer 230 and wiring layer 130 laminated in that order on the first-surface side of substrate 101. On the other hand, laminated section 12 is formed with insulation layer 220, wiring layer 120, insulation layer 240 and wiring layer 140 laminated in that order on the second-surface side of substrate 101. Here, insulation layers 210, 220, 230, 240 correspond to interlayer insulation layers, and wiring layers 110, 120, 130, 140 correspond to conductive layers.

In insulation layers 210, 220, 230, 240, tapered (such as cone-shaped) via holes (212a, 221a, 222a, 232a, 241a, 242a) are formed. Then, inside via holes (212a, 221a, 222a, 232a, 241a, 242a), conductors (212b, 221b, 222b, 232b, 241b, 242b) are filled so that each forms a filled via.

Pads (200a) (such as aluminum pads) are electrically connected to external connection terminals (321b) or (322b) by means of via holes (221a, 222a, 241a, 242a), their respective internal conductors (221b, 222b, 241b, 242b), and wiring layers 120, 140. Among external connection terminals (321b) and (322b), external connection terminal 22 in FIG. 10, for example, is positioned away from a spot directly over pad (200a) by shifting the terminal position from inside toward the outer-layer side (the arrow-Z2 side) using extended wiring (200b) and wiring layers 120, 140. Also, external connection terminal 21 in FIG. 10 is positioned away from the spot directly over pad (200a) by being shifted further inside. Namely, external connection terminals 21, 22 are offset from spots directly over pads (200a). Especially, using wiring layers 120, 140, a terminal position is offset in stages (in two stages) going through two interlayer insulation layers (insulation layers 220, 240). Moreover, the offset amount of a terminal position is greater on wiring layer 140 on the outer-layer side (upper layer) than on wiring layer 120 on the inner-layer side (lower layer).

Via hole (241a) is not positioned directly over another via hole (221a) formed in insulation layer 220 (another interlayer insulation layer) adjacent to the lower surface of insulation layer 240 (interlayer insulation layer) in which via hole (241a) is formed. Also, external connection terminals 21, 22 are not positioned directly over via holes (241a) formed in insulation layer 240 (interlayer insulation layer) on which external connection terminals 21, 22 are formed.

Because of such a structure, in wiring board 20 of the present embodiment, even higher reliability may be achieved in the electrical connection of pads (200a) or the like. In the following, simulation results regarding such are described with reference to FIGS. 11A-19.

A simulation examiner carried out simulations on sample Leg 1, Leg 2, Leg 3 and Leg 4 shown in FIGS. 11A, 11B, 11C and 11D respectively. Each of sample Legs 1-4 is formed with first insulation layer 33, first conductive layer 34, second insulation layer 35, second conductive layer 36 and solder-resist layer 37 laminated on the surface of electronic component 30 in that order. In opening portion (37a) of solder-resist layer 37 as the outer layer, external connection terminal 38 made of solder is formed.

Electronic component 30 has insulation layer (30a) made of material with a low dielectric constant (Low-k) on its surface-layer side and has pad 32 made of aluminum formed on the surface. First insulation layer 33 is formed with insulation layer (31a) made of SiN and insulation layer (31b) made of polyimide.

In first insulation layer 33, tapered (cone-shaped) via hole (33a) is formed, and in second insulation layer 35, tapered (cone-shaped) via hole (35a) is formed. Via hole (33a) is filled with conductor (33b), and via hole (35a) is filled with conductor (35b). Each forms a filled via. Also, in opening portion (37a) of solder-resist layer 37, solder (37b) that forms external connection terminal 38 is filled. External connection terminal 38 is made of a solder ball.

In sample Leg 1, via holes (33a, 35a) and external connection terminal 38 are positioned directly over pad 32 of electronic component 30 (in the direction of arrow-Z2). By contrast, in sample Legs 2-4, regarding the positions of via holes (33a, 35a) and external connection terminal 38, especially among their two-dimensional positions on a main surface (X-Y plane), positions in the directions of arrow-X1 and arrow-X2 (X coordinate) are offset from pad 32 of electronic component 30 (base position).

Figure 11A:
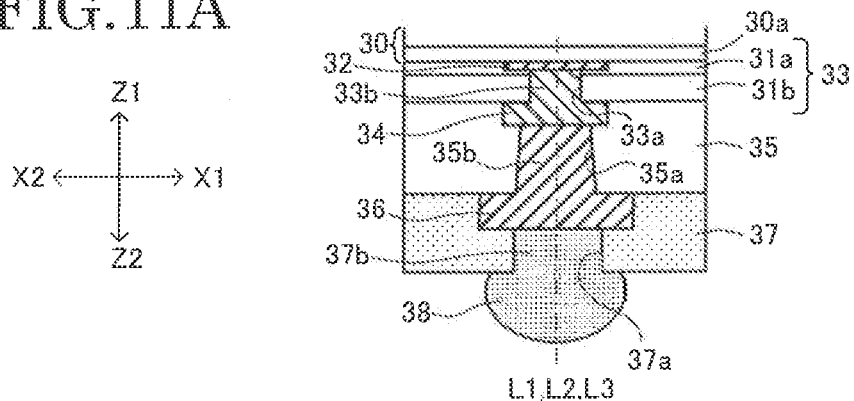
FIG. 11A is a cross-sectional view of a first sample in the first simulations.

In sample Leg 1, as shown in FIG. 11A, terminal position (L1) in first insulation layer 33 corresponds to terminal position (L2) in second insulation layer 35 and terminal position (L3) of external connection terminal 38. Terminal position (L3) corresponds to the position where external connection terminal 38 and second conductive layer 36 are connected; terminal position (L2) corresponds to the position where second conductive layer 36 and first conductive layer 34 are connected; and terminal position (L1) corresponds to the position where first conductive layer 34 and pad 32 of electronic component 30 are connected.

Figure 11B:
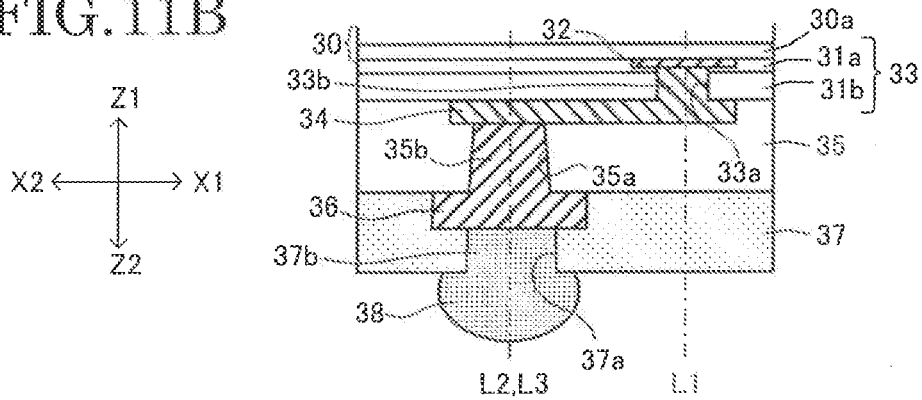
FIG. 11B is a cross-sectional view of a second sample in the first simulations.

In sample Leg 2, as shown in FIG. 11B, terminal position (L2) corresponds to terminal position (L3), and terminal positions (L2, L3) are offset toward the arrow-X2 side from terminal position (L1). Namely, via hole (33a) is positioned directly over pad 32, but neither via hole (35a) nor external connection terminal 38 is positioned directly over pad 32. However, external connection terminal 38 is positioned directly over via hole (35a).

Figure 11C:
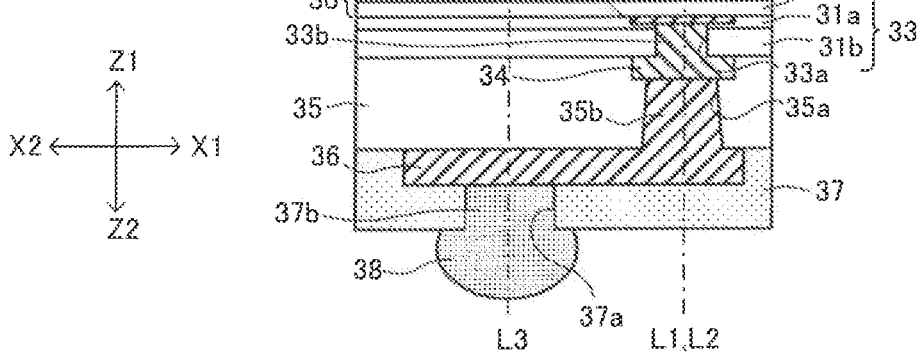
FIG. 11C is a cross-sectional view of a third sample in the first simulations.

In sample Leg 3, as shown in FIG. 11C, terminal position (L1) corresponds to terminal position (L2), and terminal position (L3) is offset toward the arrow-X2 side from terminal positions (L1, L2). Namely, via holes (33a, 35a) are positioned directly over pad 32, but external connection terminal 38 is not positioned directly over either pad 32 or via hole (35a).

Figure 11D:
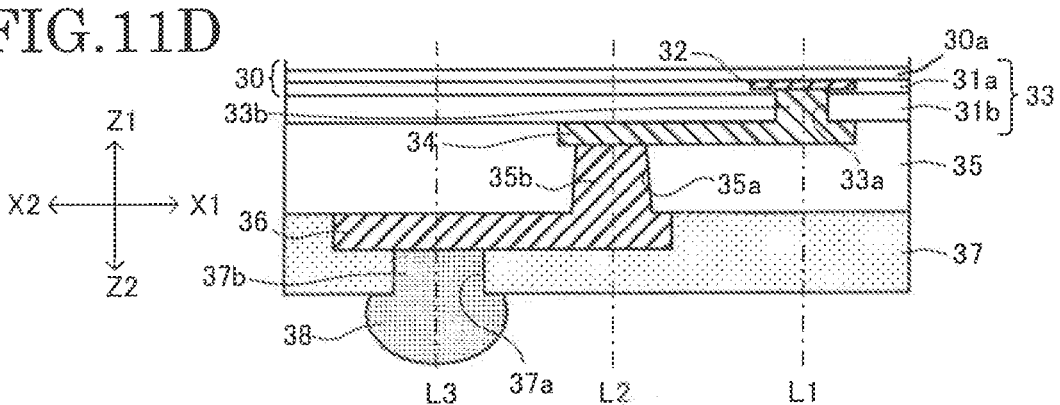
FIG. 11D is a cross-sectional view of a fourth sample in the first simulations.

In sample Leg 4, as shown in FIG. 11D, none of terminal positions (L1-L3) corresponds to each other. Both terminal positions (L2) and (L3) are offset from terminal position (L1) toward the arrow-X2 side. Namely, via hole (33a) is positioned directly over pad 32, but neither via hole (35a) nor external connection terminal 38 is positioned directly over pad 32. Also, external connection terminal 38 is not positioned directly over via hole (35a), either.

The simulation examiner measured the stresses when the above sample Legs 1-4 were cooled from a temperature of 180° C. to minus 40° C. At that time, using a sub-modeling method, an entire package was analyzed and stress was calculated in each of the detailed portions (see FIGS. 11A-11D). A sub-modeling method indicates that by imputing the analysis results from a global model (full model) to a model in which detailed portions are reproduced (sub-model), the detailed model is analyzed while the reaction of the global model is considered.

Figure 12:
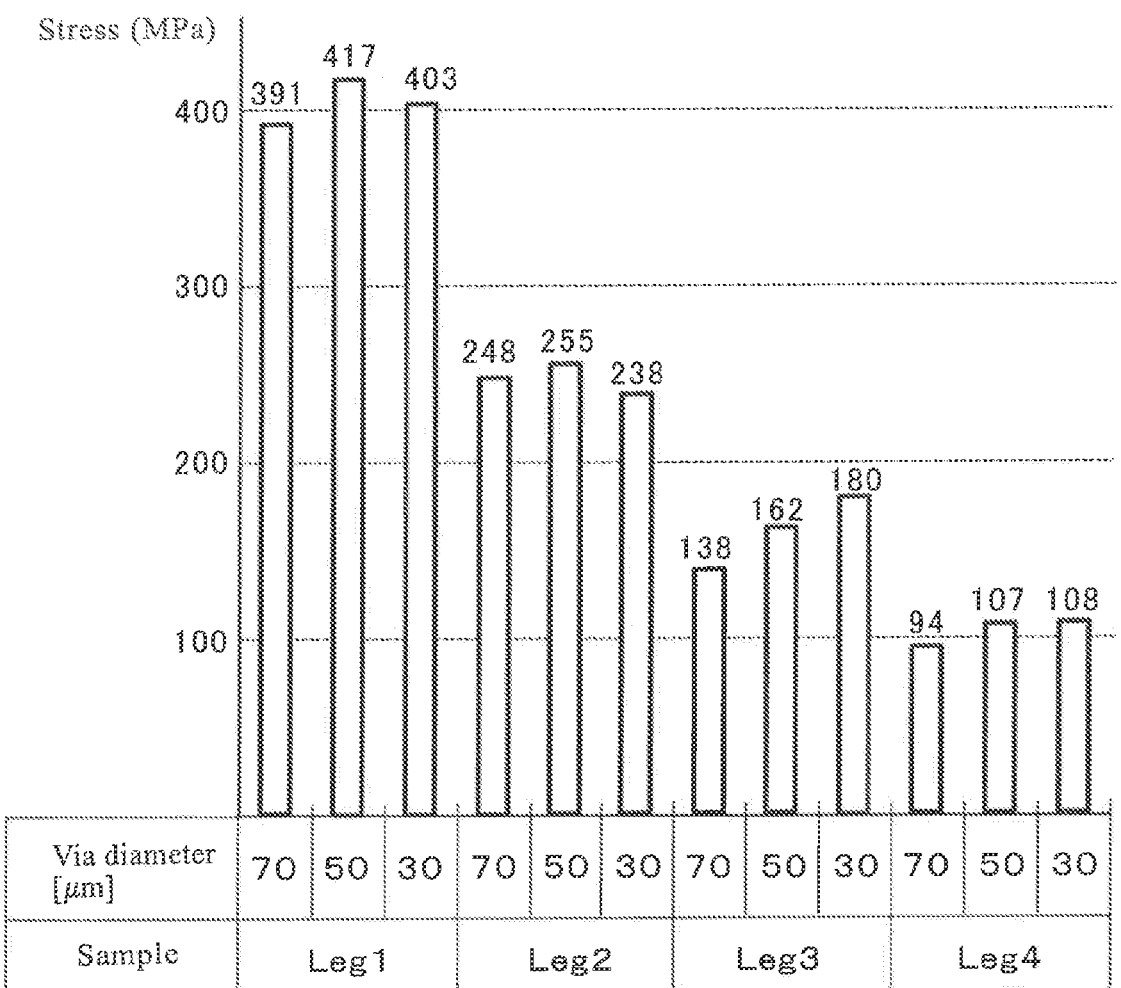
FIG. 12 is a graph showing the first simulation results regarding the stresses exerted on the first to fourth samples.

The simulation results on sample Legs 1-4 are shown in FIG. 12. The simulation examiner measured the stresses in sample Legs 1-4 when the diameters of via holes (33a, 35a)

were set at 30 μm, 50 μm and 70 μm. As shown in the graph in FIG. 12, at any diameter that was measured, the stress of each sample was the smallest in sample Leg 4 (FIG. 11D), whereas the stresses in other sample Legs 1-3 became greater in sample Leg 3 (FIG. 11C), sample Leg 2 (FIG. 11B) and sample Leg 1 (FIG. 11A) in that order.

The stress in sample Leg 1 without offset is greater than the other sample Legs 2-4 with offset. Thus, it is assumed that in order to reduce stresses in wiring boards, terminal position (L3) is preferred to be offset from being directly over pad (200*a*).

The stress in sample Leg 2 is greater than the stress in sample Leg 3. Thus, it is assumed that in order to reduce stress in wiring boards, the offset amount (second offset amount) on second conductive layer 36 on the outer-layer side is preferred to be greater than the offset amount (first offset amount) on first conductive layer 34 on the inner-layer side. Also, it is assumed that the offset amount on second conductive layer 36 on the outermost layer is preferred to be the greatest. In addition, it is also assumed that the offset amount on first conductive layer 34 on the innermost layer is preferred to be the smallest.

The stress in sample Leg 4 is the smallest. Thus, it is assumed that terminal positions are preferred to be offset in stages going through multiple layers. In such cases, the entire offset amount is equivalent to the total offset amount (first offset amount and second offset amount) on each layer.

Figure 13:
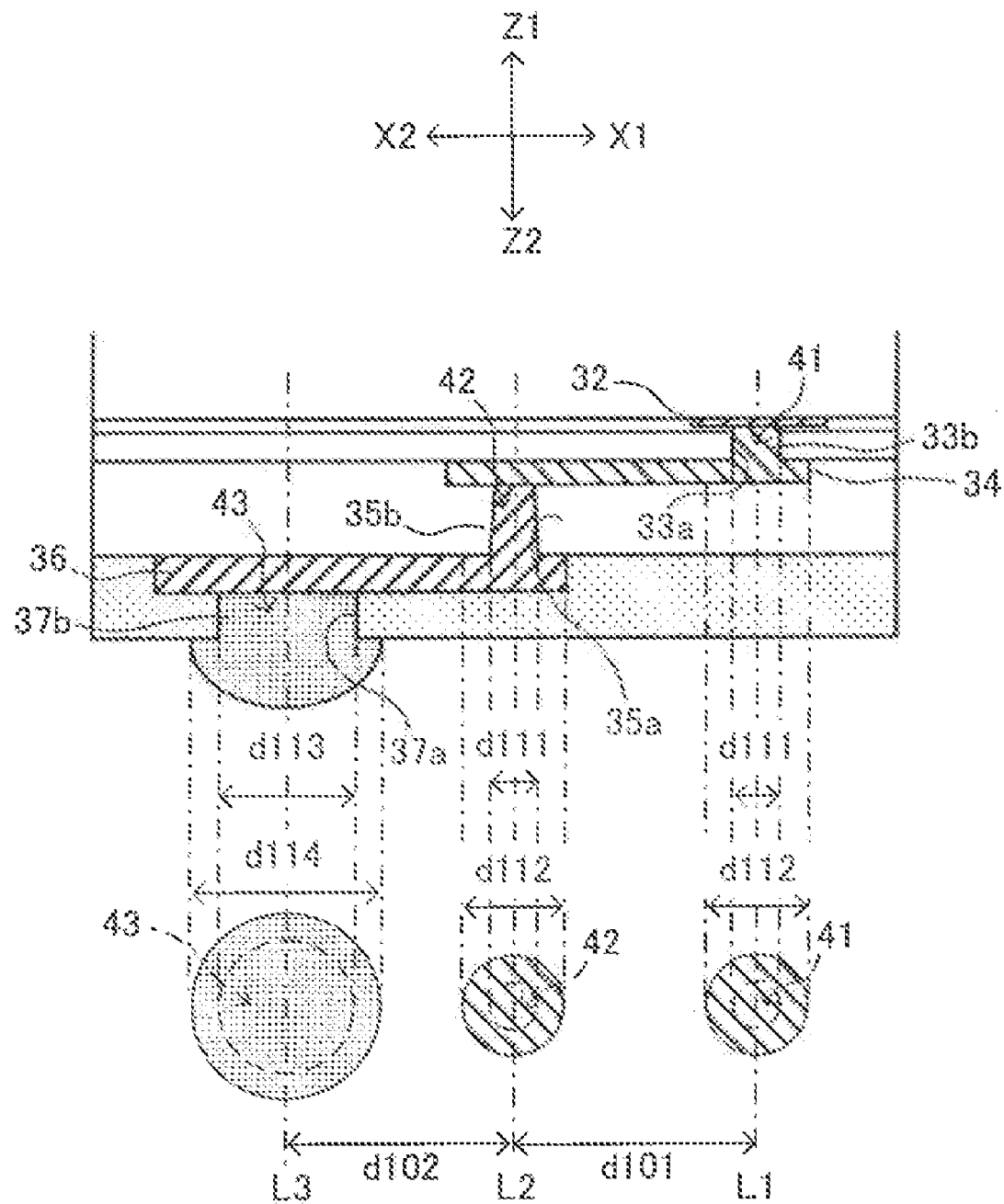
FIG. 13 is a cross-sectional view of a sample to be used in the second simulations and a plan view showing the connection portions of the sample.

Furthermore, the simulation examiner carried out simulations on sample Leg 4 shown in FIG. 13 regarding terminal positions (L1, L2, L3). In sample Leg 4, via hole (33*a*) is filled with conductor (33*b*), via hole (35*a*) is filled with conductor (35*b*) and opening portion (37*a*) is filled with solder (37*b*). Such via holes and conductors respectively form first connection portion 41 between first conductive layer 34 and pad 32 of electronic component 30, second connection portion 42 between second conductive layer 36 and first conductive layer 34, and third connection portion 43 between external connection terminal 38 and second conductive layer 36. Such positions of first connection portion 41, second connection portion 42 and third connection portion 43 respectively correspond to terminal positions (L1, L2, L3). Here, diameters (d111) of first connection portion 41 and second connection portion 42 are set at 70 μm each, and pad diameters (d112) on first connection portion 41 and second connection portion 42 are set at 150 μm each. In addition, diameter (d113) of third connection portion 43 is set at 200 μm, and pad diameter (d114) on third connection portion 43 is set at 280 μm.

The relationship of terminal positions (L1, L2, L3) and stress distributions is studied in the following.

Figure 14A:
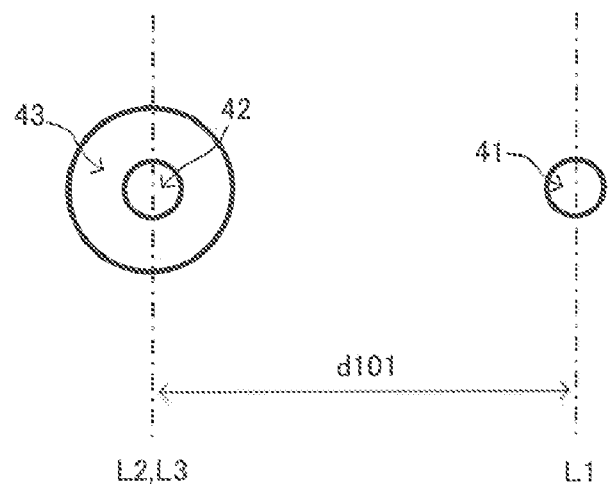
FIG. 14A is a view showing a first set of offset positions in the second simulations.
Figure 14B:
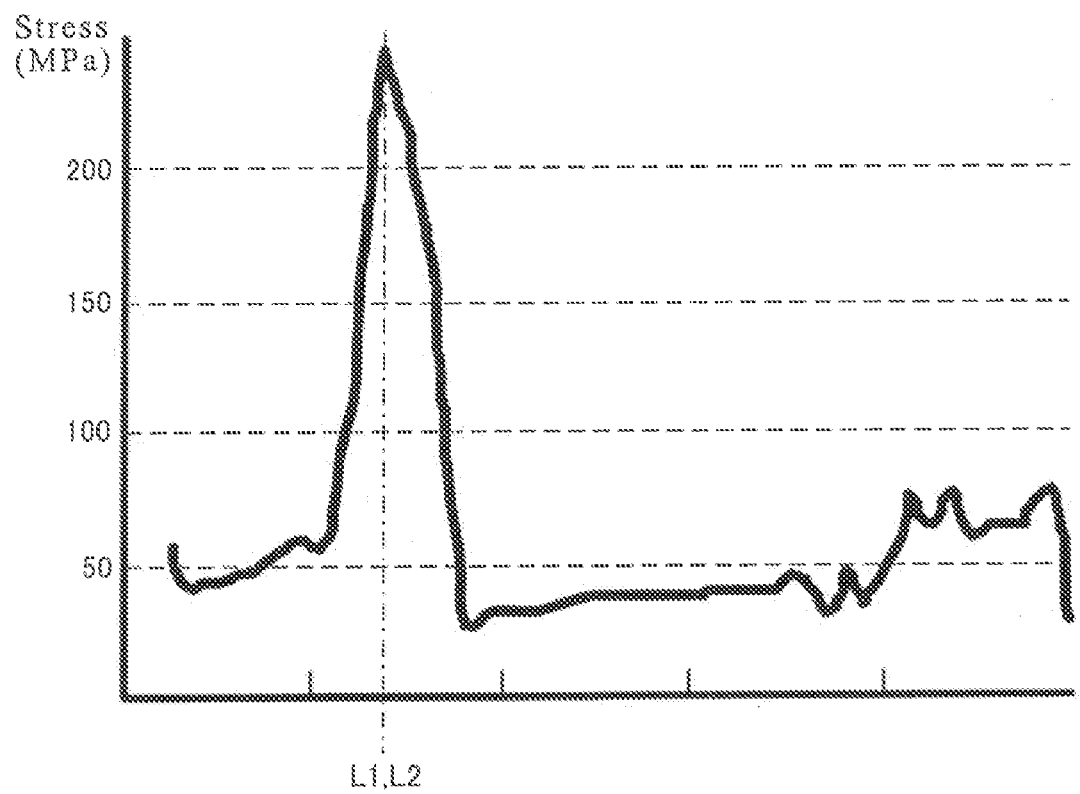
FIG. 14B is a view showing the results of the first set of offset positions in the second simulations.

FIG. 14B shows the results of the simulation carried out as follows: terminal position (L2) was set to correspond to terminal position (L3), and distance (d101) (first offset amount) between terminal position (L1) and terminal position (L2) was set at 500 μm (see FIG. 14A). Here, third connection portion 43 (external connection terminal 38) is positioned directly over second connection portion 42 (via hole 35*a*). As shown in the graph of FIG. 14B, the positions where the stress became the greatest were terminal positions (L1, L2), and the maximum stress value was approximately 245 MPa.

Figure 15A:
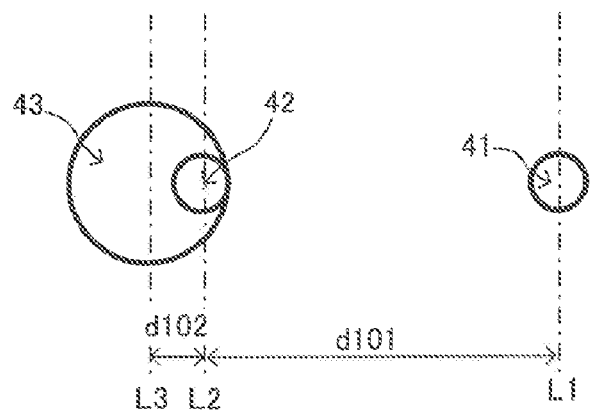
FIG. 15A is a view showing a second set of offset positions in the second simulations.
Figure 15B:
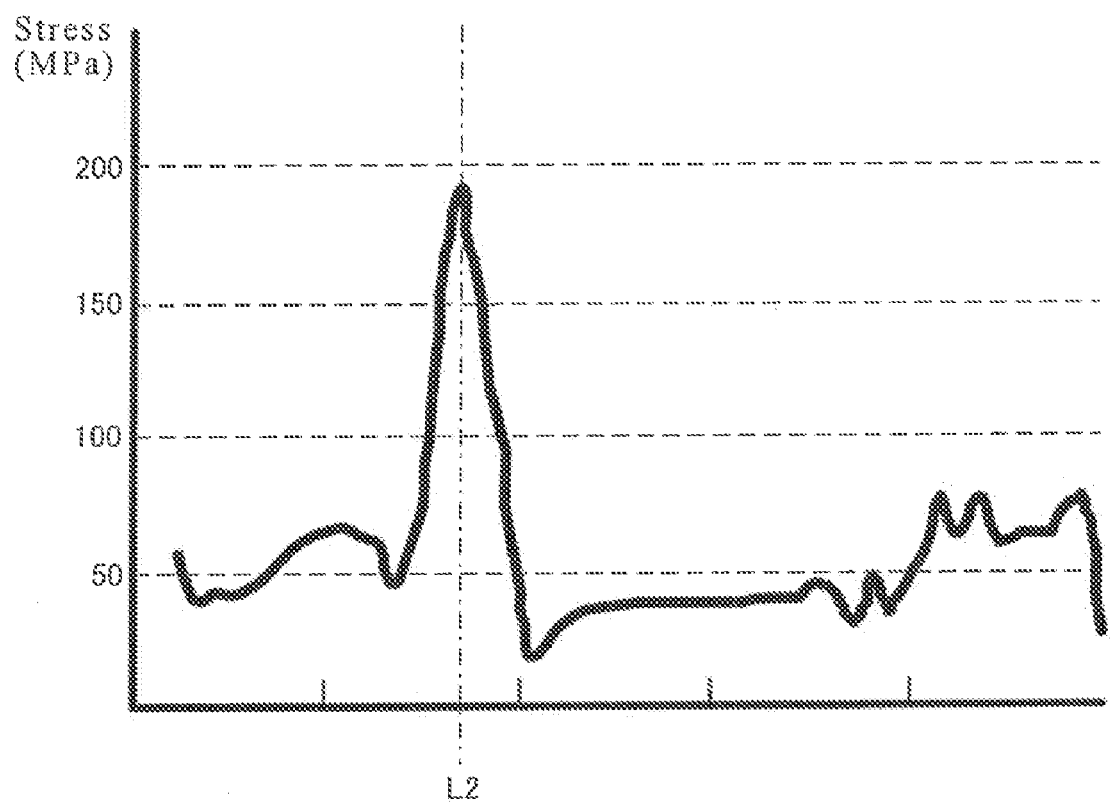
FIG. 15B is a view showing the results of the second set of offset positions in the second simulations.

FIG. 15B shows the results of the simulation carried out as follows: distance (d102) (second offset amount) between terminal position (L2) and terminal position (L3) was set at 65 μm, and distance (d101) (first offset amount) between terminal position (L1) and terminal position (L2) was set at 435 μm (see FIG. 15A). Here, third connection portion 43 (external connection terminal 38) is positioned directly over second connection portion 42 (via hole 35*a*). The boundary of third connection portion 43 (external connection terminal 38) on the arrow-X1 side (FIG. 13) and the boundary of second connection portion 42 (via hole 35*a*) on the arrow-X1 side (FIG. 13) overlap in the directions of arrows (Z1, Z2) (FIG. 13). As shown in the graph of FIG. 15B, the position where the stress became the greatest in this simulation was terminal position (L2), and the maximum stress value was approximately 190 MPa.

Figure 16A:
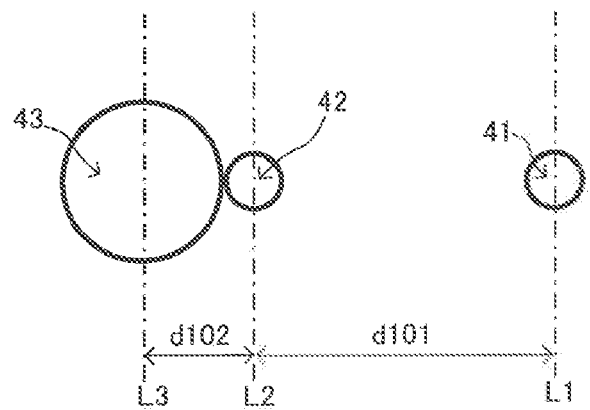
FIG. 16A is a view showing a third set of offset positions in the second simulations.
Figure 16B:
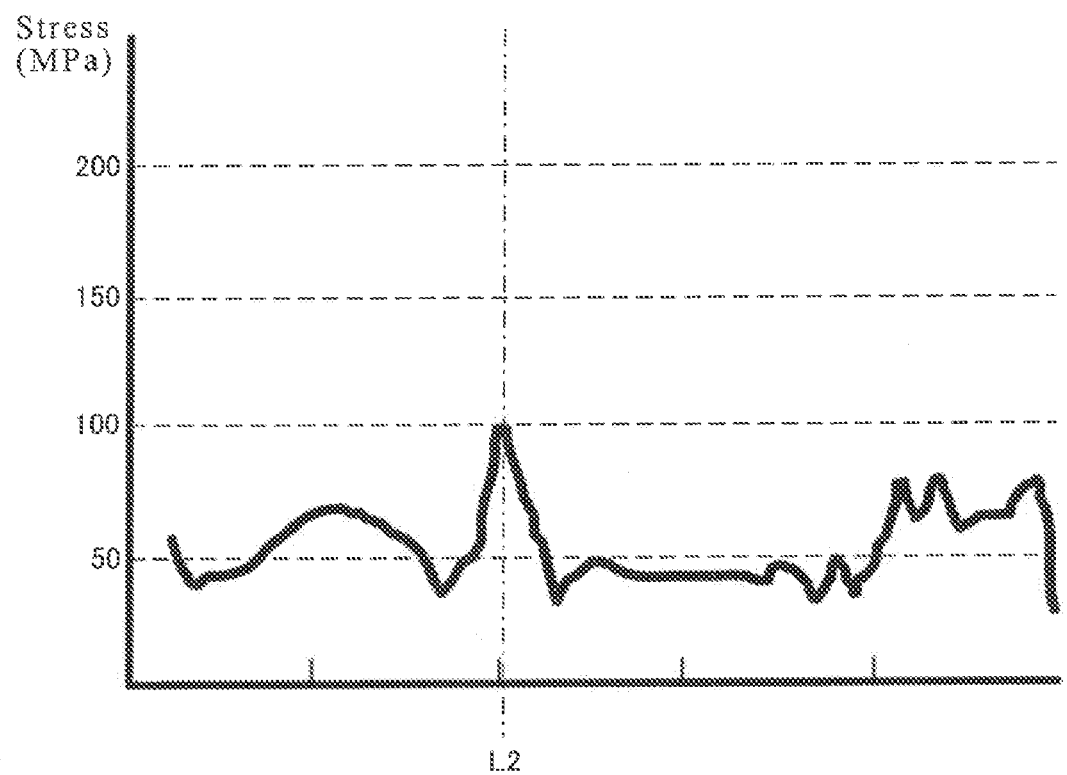
FIG. 16B is a view showing the results of the third set of offset positions in the second simulations.

FIG. 16B shows the results of the simulation carried out as follows: distance (d102) (second offset amount) between terminal position (L2) and terminal position (L3) was set at 135 μm, and distance (d101) (first offset amount) between terminal position (L1) and terminal position (L2) was set at 365 μm (see FIG. 16A). Here, the boundary of third connection portion 43 (external connection terminal 38) on the arrow-X1 side (FIG. 13) and the boundary of second connection portion 42 (via hole 35*a*) on the arrow-X2 side (FIG. 13) overlap in the directions of arrows (Z1, Z2) (FIG. 13). Third connection portion 43 is set away from being directly over second connection portion 42. Namely, in the range where third connection portion 43 is not positioned directly over second connection portion 42 and second connection portion 42 is not positioned directly over first connection portion 41, distance (d102) (second offset amount) becomes the smallest. As shown in the graph of FIG. 16B, the position where the stress became the greatest in this simulation was terminal position (L2) and the maximum stress value was approximately 100 MPa.

Figure 17A:
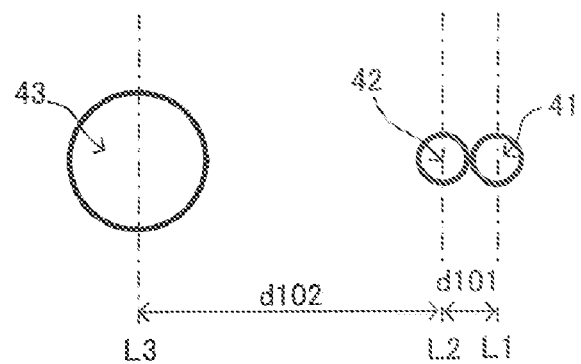
FIG. 17A is a view showing a fourth set of offset positions in the second simulations.
Figure 17B:
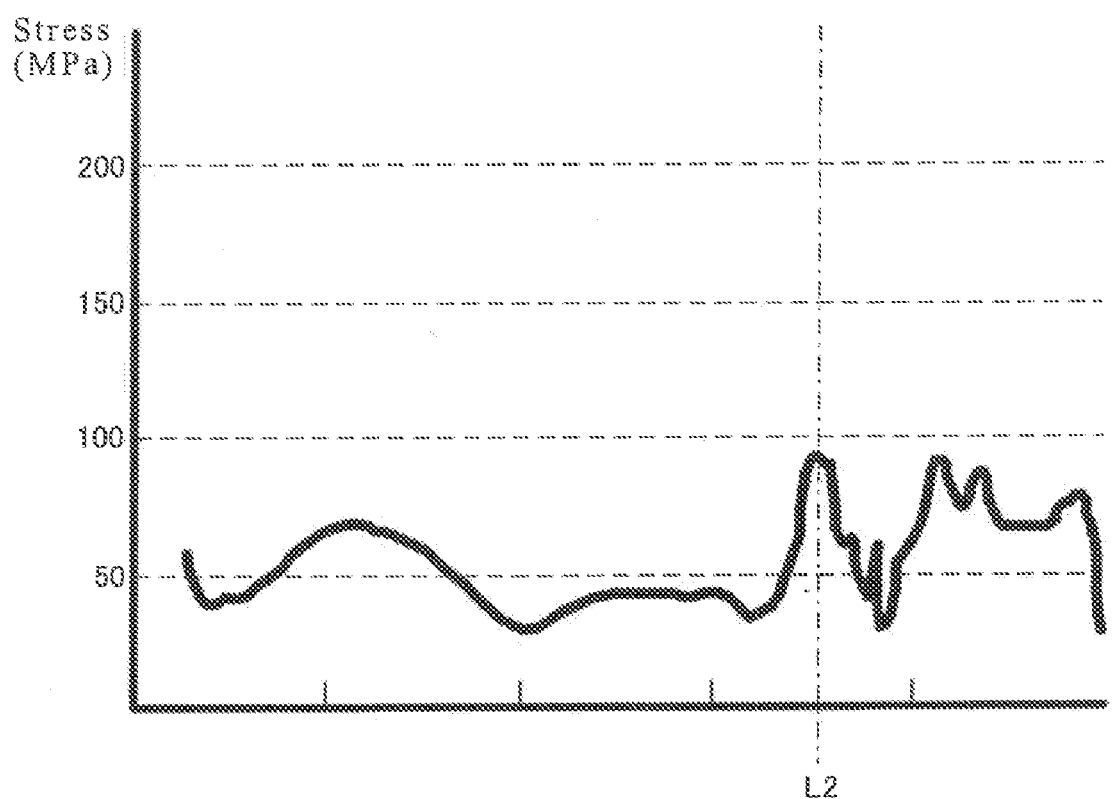
FIG. 17B is a view showing the results of the fourth set of offset positions in the second simulations.

FIG. 17B shows the results of the simulation carried out as follows: distance (d102) (second offset amount) between terminal position (L2) and terminal position (L3) was set at 430 μm, and distance (d101) (first offset amount) between terminal position (L1) and terminal position (L2) was set at 70 μm (see FIG. 17A). Here, the boundary of second connection portion 42 (via hole 35*a*) on the arrow-X1 side (FIG. 13) and the boundary of first connection portion 41 (via hole 33*a*) on the arrow-X2 side (FIG. 13) overlap in the directions of arrows (Z1, Z2) (FIG. 13). Namely, in the range where third connection portion 43 is not positioned directly over second connection portion 42 and second connection portion 42 is not positioned directly over first connection portion 41, distance (d102) (second offset amount) becomes the greatest. As shown in the graph of FIG. 17B, the position where the stress became the greatest in this simulation was terminal position (L2), and the maximum stress value was approximately 85 MPa.

Figure 18A:
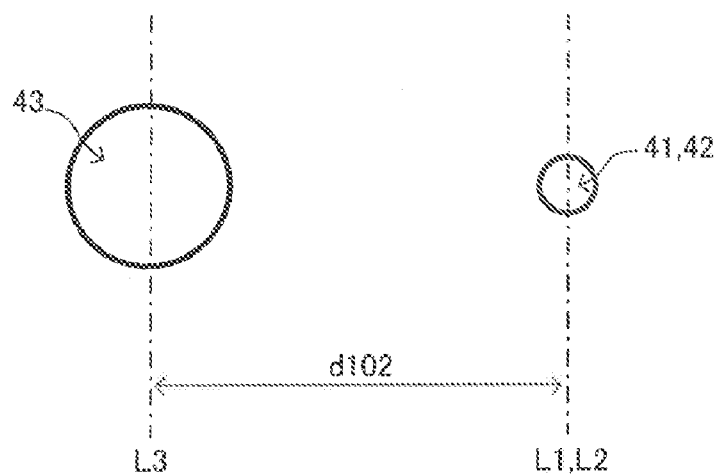
FIG. 18A is a view showing a fifth set of offset positions in the second simulations.
Figure 18B:
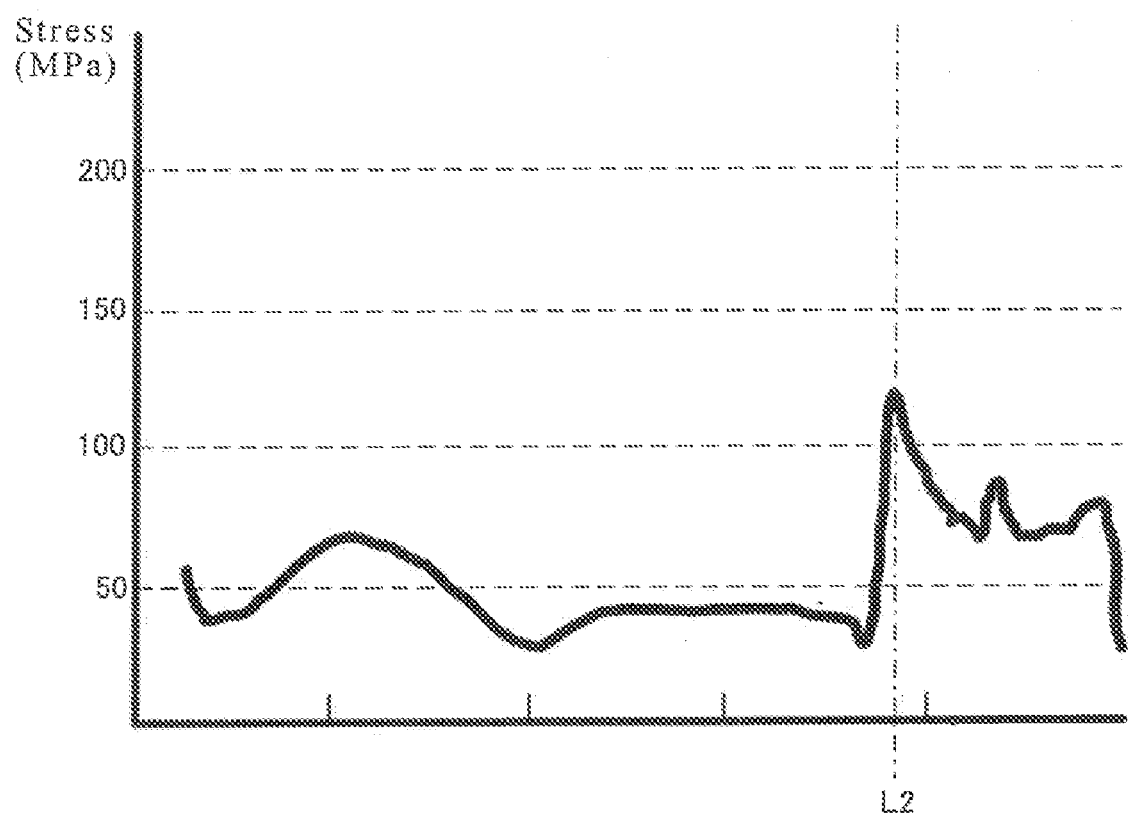
FIG. 18B is a view showing the results of the fifth set of offset positions in the second simulations.

FIG. 18B shows the results of the simulation carried out as follows: terminal position (L1) was set to correspond to terminal position (L2) and distance (d102) (second offset amount) between terminal position (L2) and terminal position (L3) was set at 500 μm (see FIG. 18A). Here, second connection portion 42 (via hole 35*a*) is positioned directly over first connection portion 41 (via hole 33*a*). First connection portion 41 (via hole 33*a*) and second connection portion 42 (via hole 35*a*) overlap in the directions of arrows (Z1, Z2) (FIG. 13). As shown in the graph of FIG. 18B, the positions where the stress became the greatest in this simulation were terminal positions (L1, L2), and the maximum stress value was approximately 120 MPa.

Figure 19:
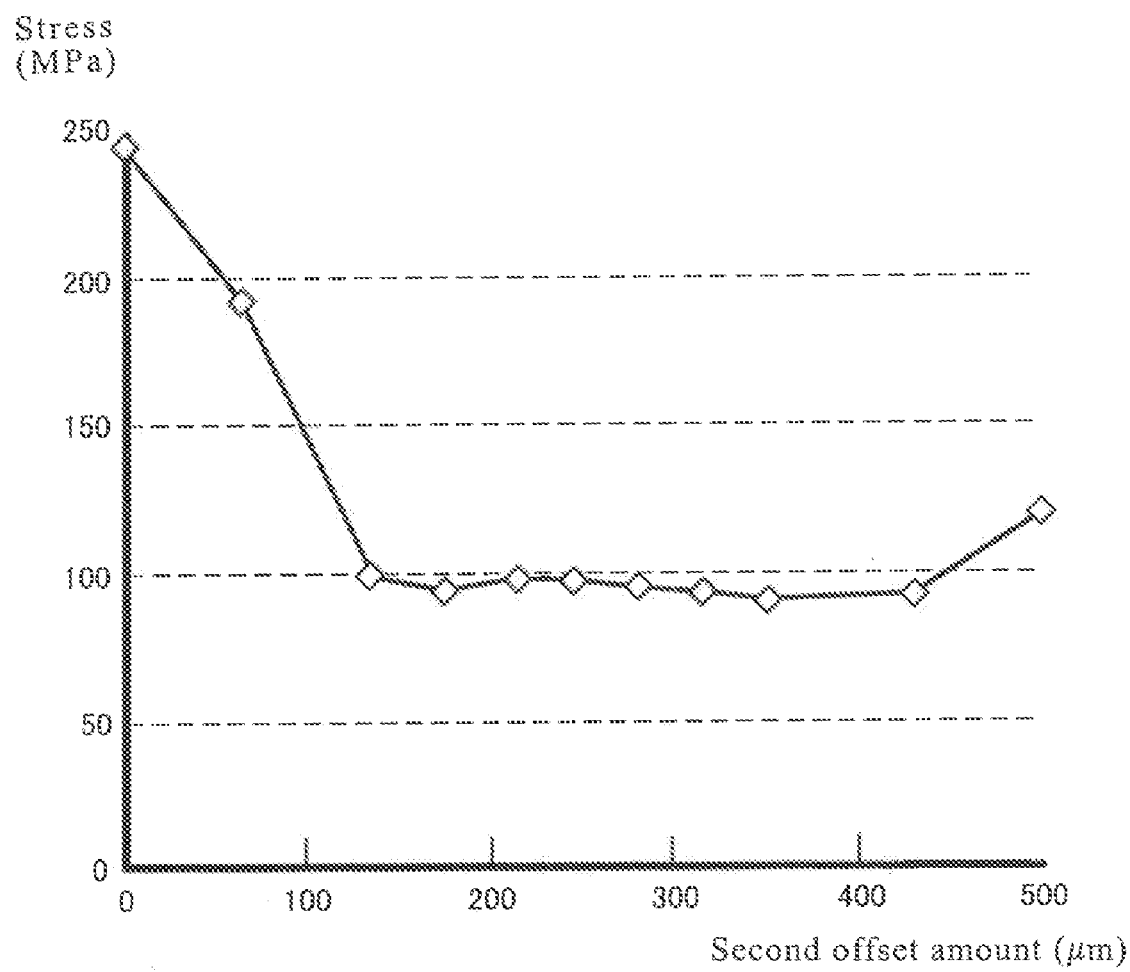
FIG. 19 is a graph showing the second simulation results of each set of offset positions and stress distributions.

FIG. 19 shows the relationship of distance (d102) (second offset amount) between terminal position (L2) and terminal position (L3) and stress distributions. As shown in the graph, smaller stresses are observed in cases where distance (d102) (second offset amount) is set in the range of 135 μm (FIG. 16A) to 430 μm (FIG. 17A). From such results, it is assumed that stresses conveyed to electronic component 30 are mitigated in structures where via hole (35*a*) is not positioned directly over other via hole (33*a*) formed in first insulation layer 33 (other interlayer insulation layer) adjacent to the lower surface of second insulation layer 35 (interlayer insulation layer) where via hole (35*a*) is formed. Also, it is assumed that stresses conveyed to electronic component 30 are mitigated in structures where external connection terminal 38 is not positioned directly over via hole (35*a*) formed in second insulation layer 35 (interlayer insulation layer) where external connection terminal 38 is formed. Moreover, in order to mitigate stresses in wiring boards, it is assumed that the offset amount (second offset amount) on second conductive layer 36 on the outer-layer side is preferred to be greater than the offset amount (first offset amount) on first conductive layer 34 on the inner-layer side.

In addition, it is thought that the same results may be obtained when three or more layers of interlayer insulation layers and conductive layers are laminated.

As described so far, in wiring board 20 of the present embodiment, even higher reliability is achieved in electrical connections of pad (200*a*) and others. Such wiring board 20 may be manufactured by further laminating insulation layers 230, 240 and wiring layers 130, 140 after the procedures shown previously in FIGS. 7A-8D. However, to form filled vias, conductors (212*b*, 221*b*, 222*b*, 232*b*, 241*b*, 242*b*) are respectively filled inside via holes (212*a*, 221*a*, 222*a*, 232*a*, 241*a*, 242*a*).

In the above, wiring boards and manufacturing methods according to the embodiments of the present invention are described. However, the present invention is not limited to such. For example, the present invention may be carried out by modifying as follows.

Figure 20:
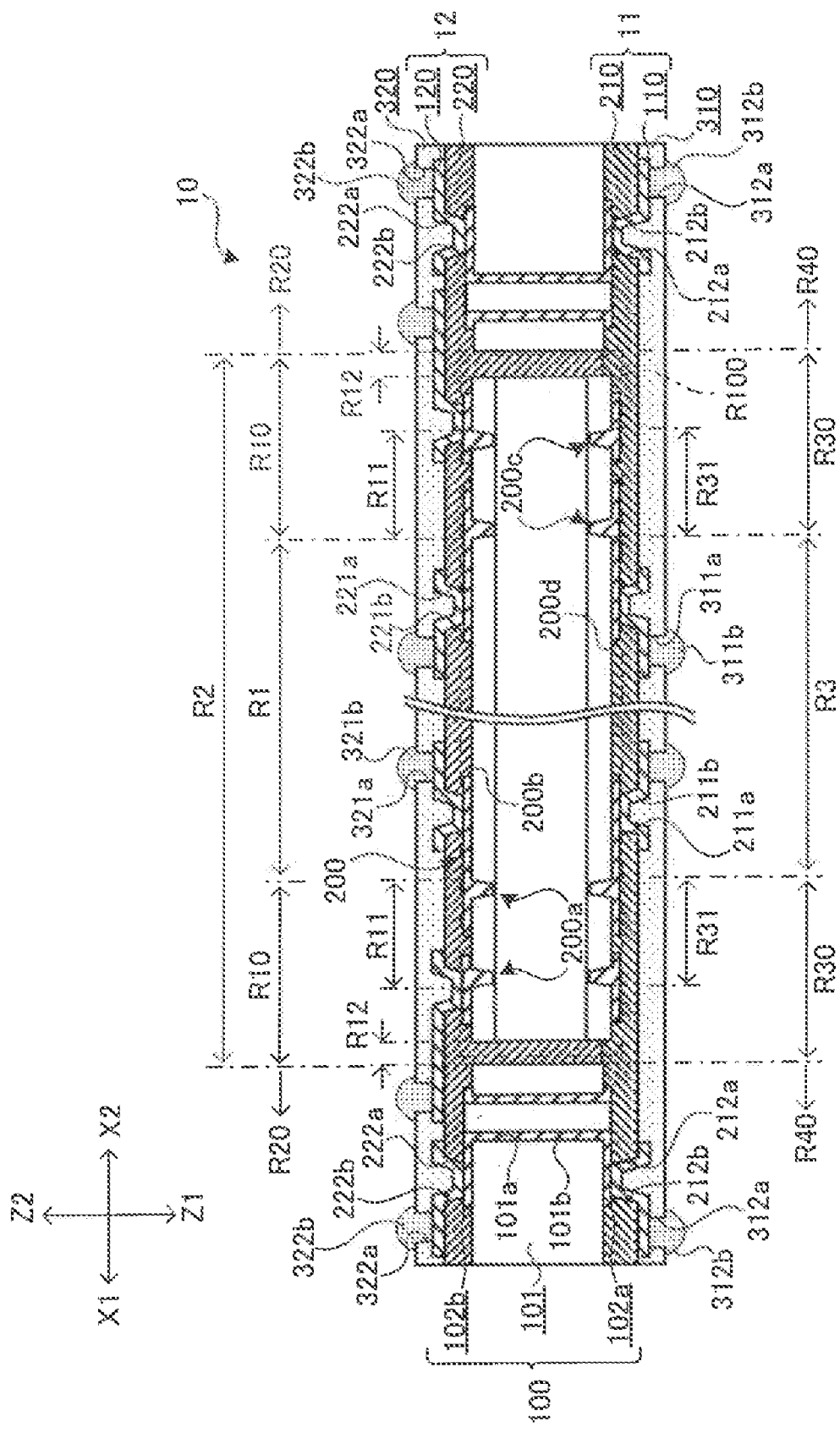
FIG. 20 is a view showing an example of a wiring board with a built-in electronic component having pads on both surfaces.

In the First and Second Embodiments, an electronic component having pads on the first surface as well as on the second surface may be built into a wiring board. For example, in the First Example, if electronic component 200 having pads (200*c*) and extended wiring (200*d*) on the first surface as well as on the second surface is built into a wiring board, stresses are also reduced in first-surface pads (200*c*) as well as second-surface pads (200*a*) by forming external connection terminals (311*b*, 312*b*) (third external connection terminals and fourth external connection terminals) to avoid being directly over multiple pads (200*c*) (second pads) of electronic component 200, as shown in FIG. 20. In the case shown in FIG. 20, each of external connection terminals (311*b*, 312*b*) is positioned to avoid region (R30) that is contiguous from the inner boundary of pad region (R31) to the external boundary of clearance (R12). External connection terminals (311*b*, 312*b*) and pads (200*c*) are electrically connected to each other by means of a conformal via formed with via hole (211*a*) and conductor (211*b*) or a conformal via formed with via hole (212*a*) and conductor (212*b*).

Figure 21:
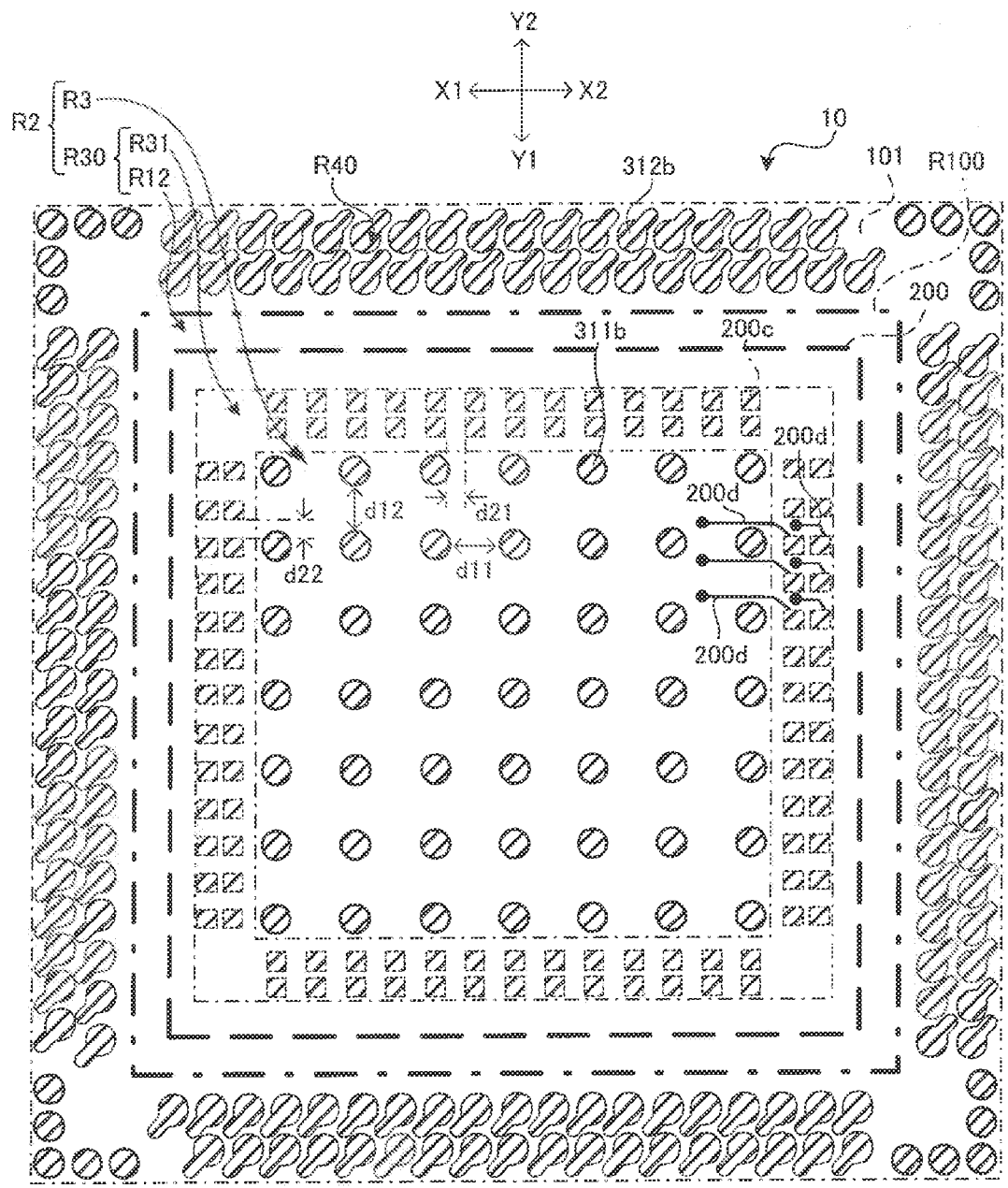
FIG. 21 is a view showing two-dimensional positions of components of the wiring board shown in FIG. 20 when the components are projected onto the same plane.

FIG. 21 shows two-dimensional positions of pads (200*c*) (second pads), external connection terminals (311*b*) (third external connection terminals) and external connection terminals (312*b*) (fourth external connection terminals) when such elements are projected onto the first surface of substrate 101.

In wiring board 10 shown in FIG. 21, when pads (200*c*) and external connection terminals (311*b*, 312*b*) are projected onto the first surface of substrate 101, external connection terminals (311*b*) are positioned to be surrounded by pads (200*c*), while pads (200*c*) and external connection terminals (311*b*) are positioned to be surrounded by external connection terminals (312*b*). Namely, on the first-surface side, in fourth region (R4) surrounded by external connection terminals (312*b*) (fourth external connection terminals), pads (200*c*) are positioned on the inner layer; and external connection terminals (311*b*) (third external connection terminals) are positioned on the outer layer. External connection terminals (311*b*) are positioned on the outer layer of inner region (R3) (third region) surrounded by pads (200*c*). On the other hand, on the second-surface side, as shown previously in FIG. 1, in second region (R2) surrounded by external connection terminals (322*b*) (second external connection terminals), pads (200*a*) are positioned on the inner layer; and external connection terminals (321*b*) (first external connection terminals) are positioned on the outer layer. Then, external connection terminals (321*b*) are positioned on the outer layer of inner region (R1) (first region) surrounded by pads (200*a*).

According to such a structure, external connection terminals (321*b*, 311*b*) (first external connection terminals, third external connection terminals) may be positioned inside the area where electronic component 200 is positioned (inner regions (R1, R3)). Also, external connection terminals (322*b*, 312*b*) (second external connection terminals, fourth external connection terminals) may be positioned outside electronic component 200 (external regions (R20, R40)). Accordingly, electronic component 200 with high-density wiring on its first surface as well as on its second surface may be mounted without resulting in larger-type wiring board 10 and a subsequent decrease in connection reliability.

Figure 22:
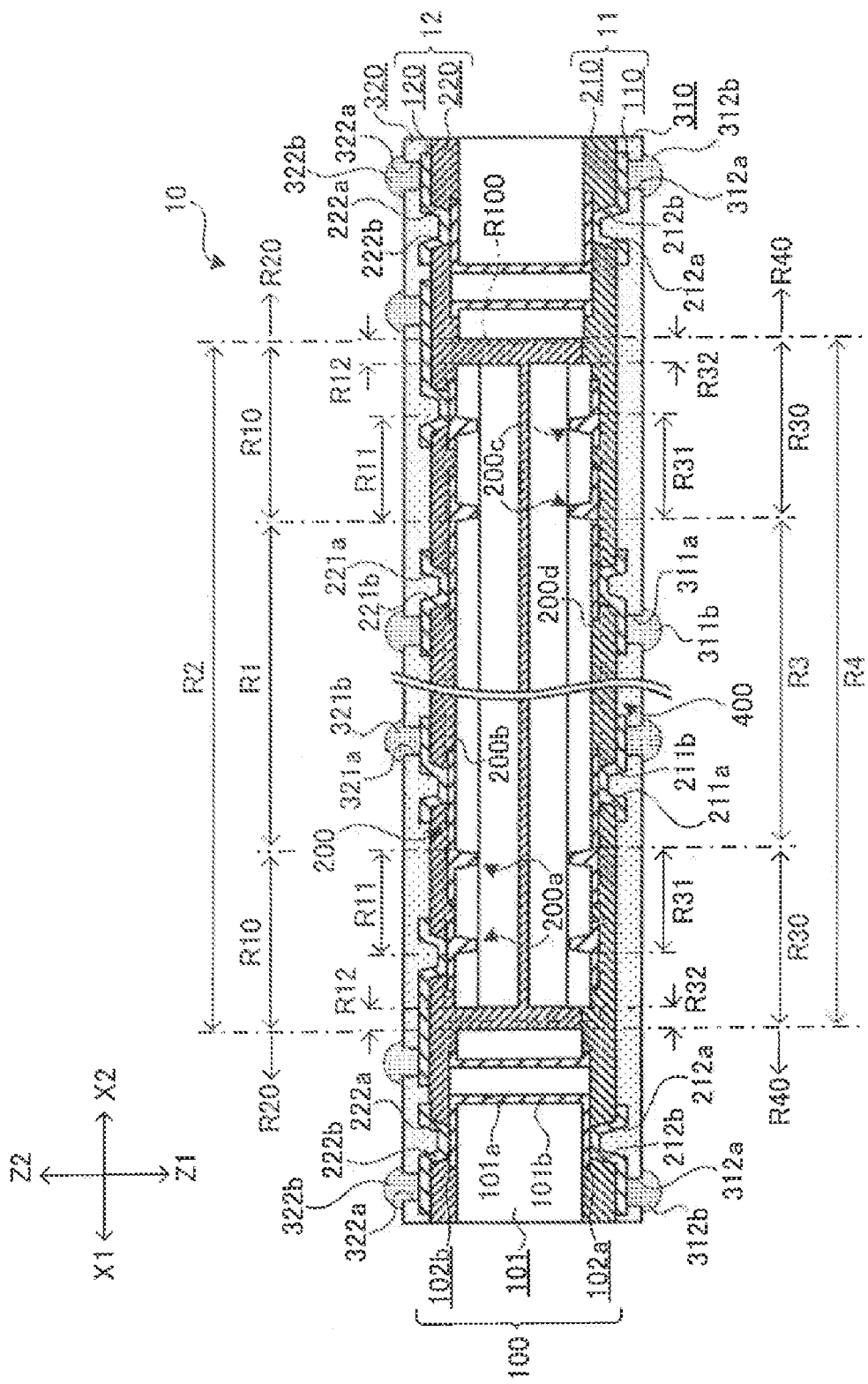
FIG. 22 is a view showing an example of a wiring board with multiple built-in electronic components.

In the First and Second Embodiments, multiple electronic components may be built into a wiring board. For example, in the First Embodiment when electronic components 200, 400 are built into a wiring board, the above effects may be achieved by arranging, as shown in FIG. 22, for example, external connection terminals (311*b*, 312*b*) on the first-surface side and external connection terminals (321*b*, 322*b*) on the second-surface side at the same positions as those previously shown in FIGS. 20, 21. In such a case, external connection terminals (311*b*, 312*b*) correspond to first external connection terminals and second external connection terminals respectively. Also, both pads (200*a*) and (200*c*) correspond to first pads. The layout of pads (200*a*) or clearance (R12) or the like in electronic component 200 may be the same as or different from the layout of pads (200*c*) or clearance (R32) or the like in electronic component 400.

Figure 23:
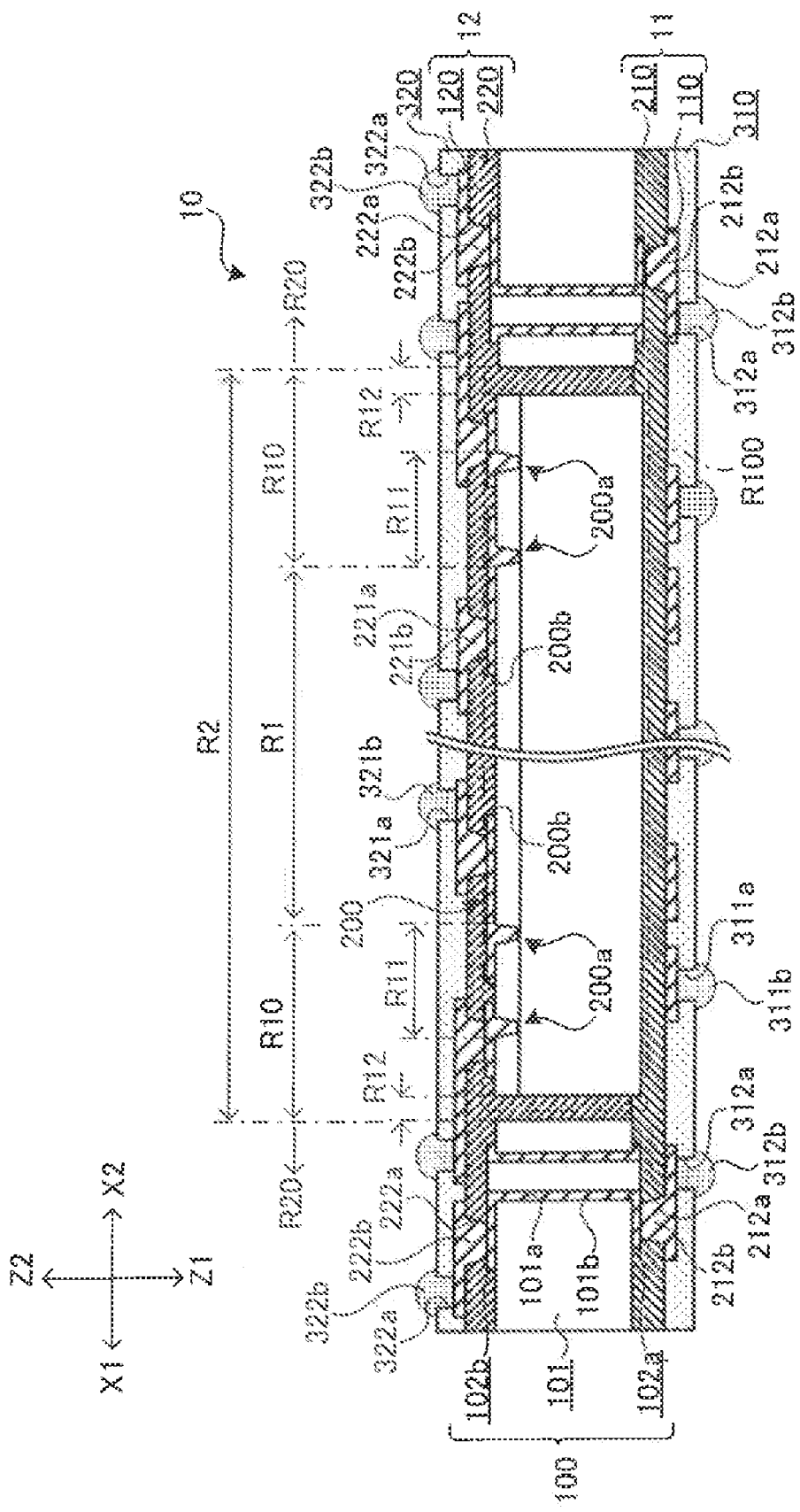
FIG. 23 is a view showing an example of a wiring board having filled vias.

In wiring boards 10, 20 of the First and Second Embodiments, via holes may be such to form conformal vias or filled vias. For example, in the First Embodiment, via holes (212*a*, 221*a*, 222*a*) may be set as filled vias filled with conductors (212*b*, 221*b*, 222*b*) as shown in FIG. 23, for example.

Figure 24:
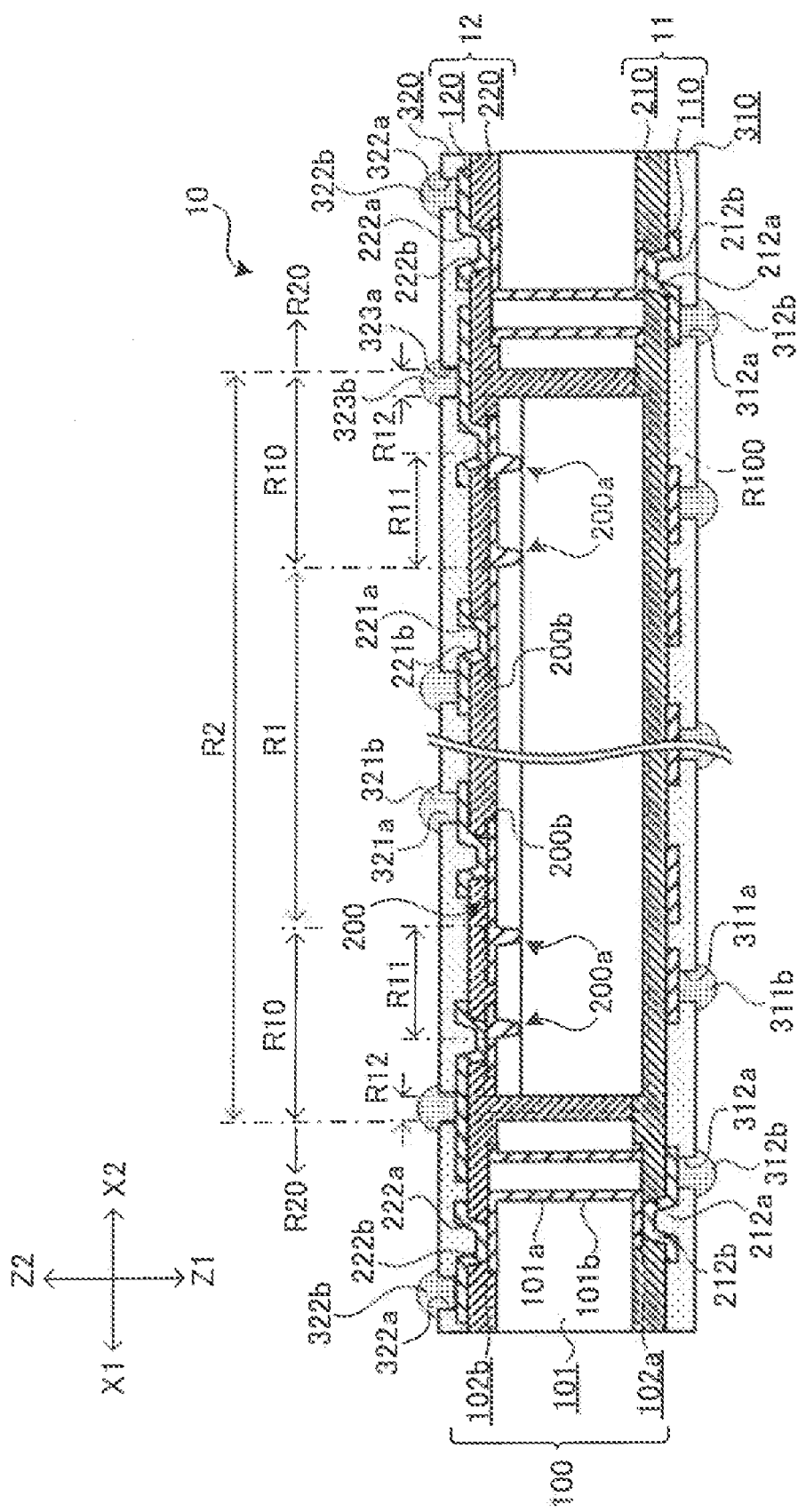
FIG. 24 is a view showing an example of a wiring board in which a second external connection terminal is positioned directly over a clearance between the substrate and an electronic component.

In the First and Second Embodiments, external connection terminals may be positioned directly over clearance (R12) if the flatness of a surface where the terminals are formed may be ensured. For example, in the First Embodiment, as shown in FIG. 24, opening portions (323*a*) and external connection terminals (323*b*) may be positioned directly over clearance (R12) (in the direction along a normal line of a main surface of wiring board 10) while avoiding being directly over pads (200*a*) which tend to generate heat.

Figure 25:
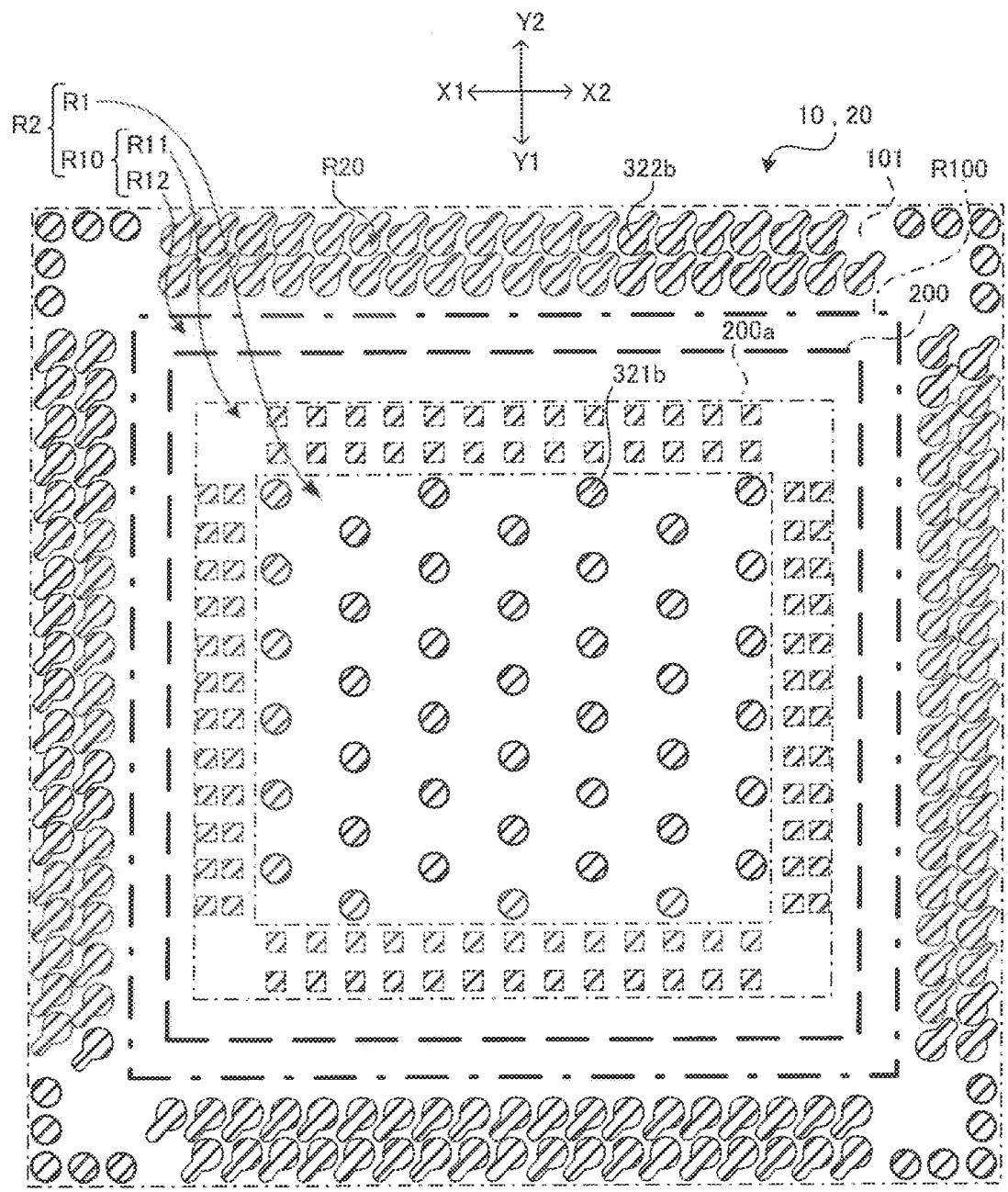
FIGS. 25-27 are views of other modified examples showing an array of first external connection terminals.
Figure 26:
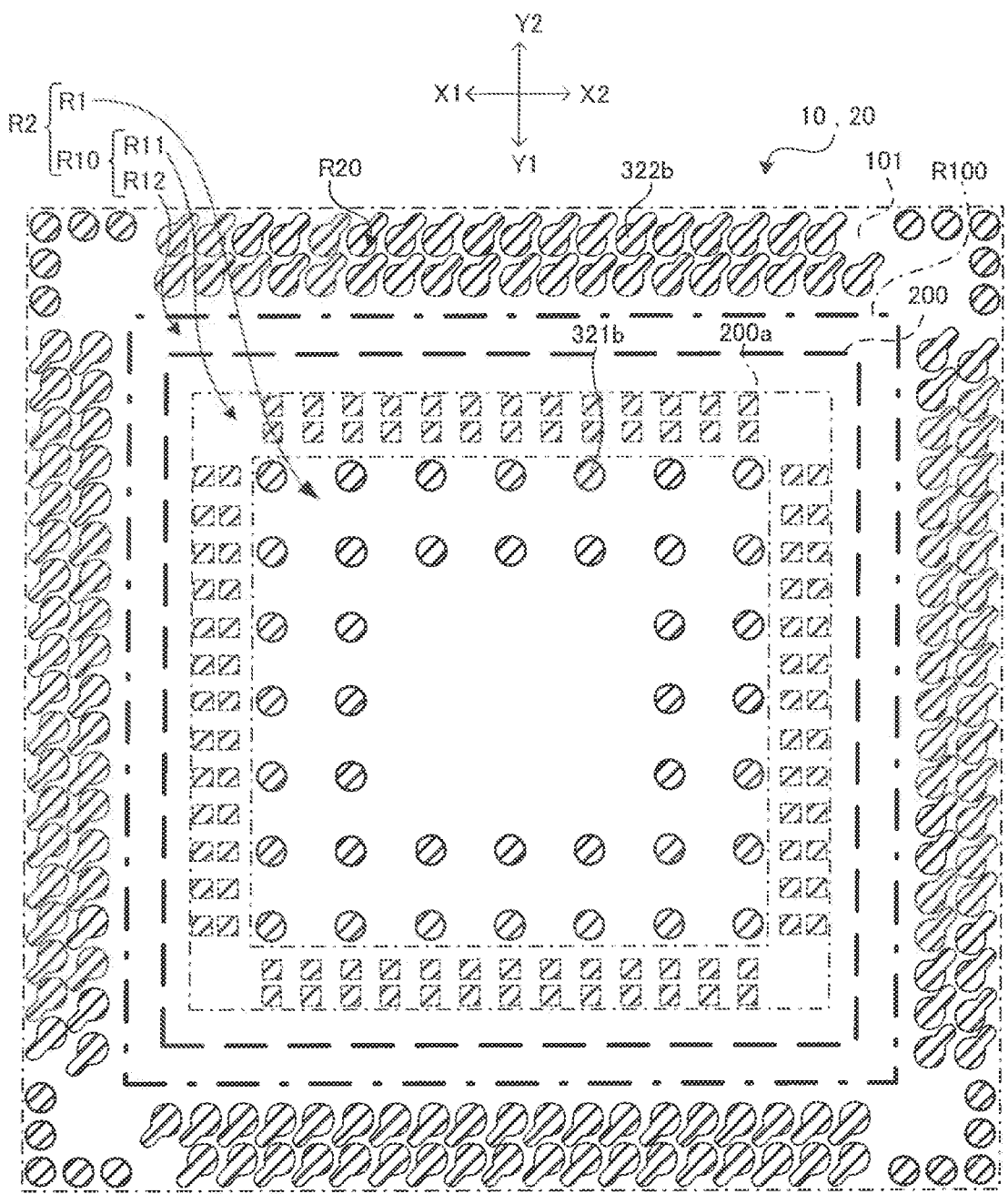
Figure 27:
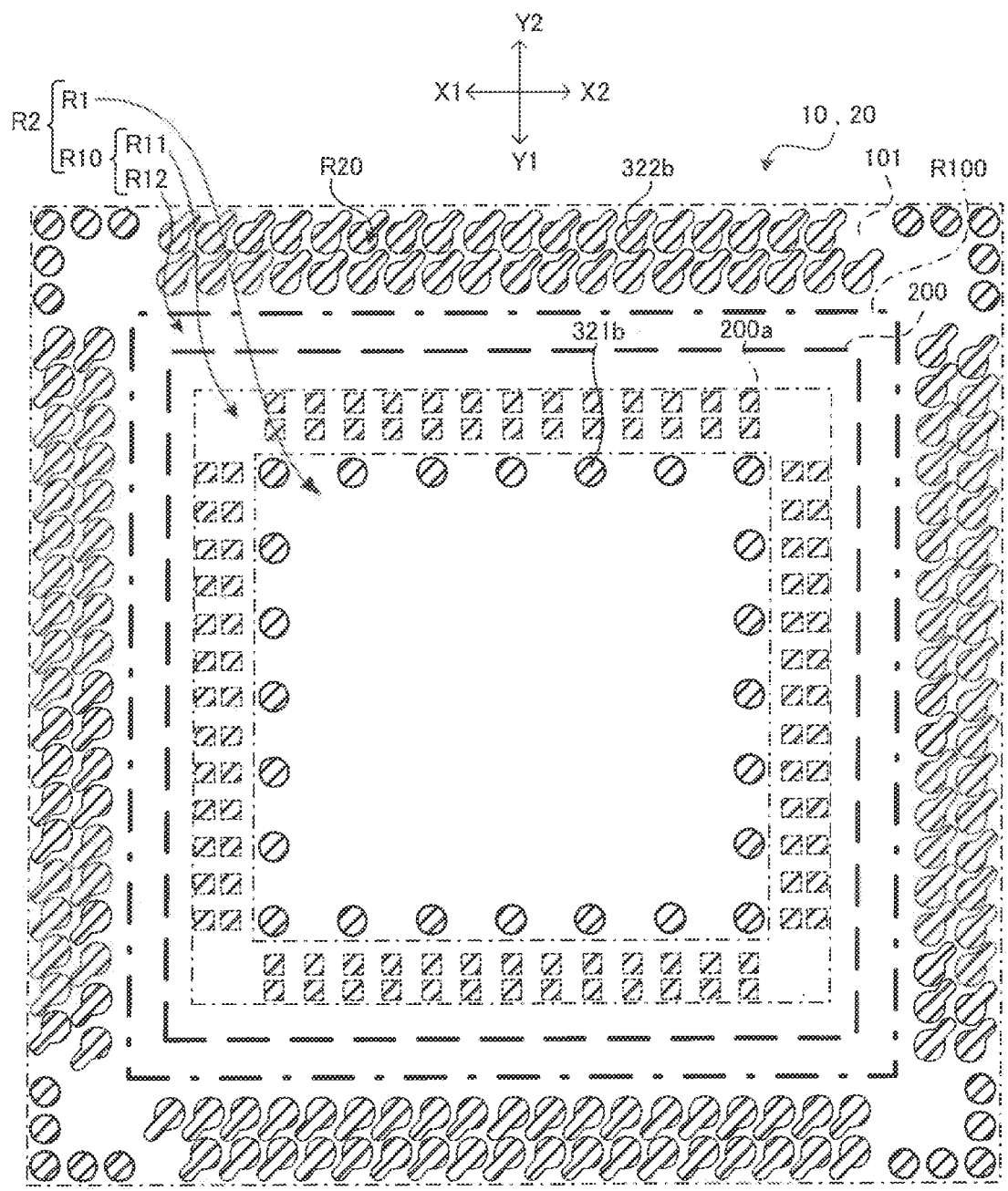

In the above embodiments, external connection terminals (321*b*) (first external connection terminals) were arranged in a lattice pattern. However, external connection terminals (321*b*) may be arranged in any pattern. For example, as shown in FIG. 25, external connection terminals (321*b*) may be arranged in a staggered pattern. Alternatively, external connection terminals (321*b*) may be arranged in a ring shape. Especially, as shown in FIG. 26, a dot array with two or more rows in a four-sided outline is preferred. Alternatively, as shown in FIG. 27, a one-row dot array in a four-sided outline is preferred. The number of external connection terminals (321*b*) is not limited to multiple numbers; it may be one.

The pitch of external connection terminals (321b) is not limited to the above pitch (minimum pitches (d11), (d12)) and may be modified according to requirements or the like.

Other than the above modifications, the array configuration of external connection terminals (322b) (second external connection terminals) in external region (R20) and the array configuration of pads (200a) in pad region (R11) are not limited specifically. In addition, the pitch and the number of external connection terminals (322b) and pads (200a) are not limited specifically.

Electronic components 200 and 400 are not limited to any specific type. For example, other than active components such as integrated circuits or the like, any type of electronic components, for example, passive components such as capacitors, resistors, coils or the like may also be used.

In the above embodiments, the quality, size, the number of layers, etc. of each layer may be modified freely.

For example, to reduce manufacturing costs or the like, wiring board 10 with a simplified structure as shown in FIG. 3 is more effective. On the other hand, to facilitate high functionality or the like, after the structure shown in FIG. 8D is completed, the lamination process may further be continued to form a wiring board having three or more layers on one side.

The order of steps of the above embodiments may be changed within a scope that does not deviate from the gist of the present invention. Also, unnecessary processes may be omitted according to requirements.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate;
   an electronic component provided inside the substrate and having a plurality of first pads; and
   a first laminated structure formed over a surface of the substrate and the electronic component and having a plurality of first external connection terminals and a plurality of second external connection terminals formed on a surface of the first laminated structure,
   wherein the first pads of the electronic component are electrically connected to the first external connection terminals and the second external connection terminals, the first external connection terminals are positioned in an inner region extending perpendicular to a plane of the surface of the substrate, the first pads are positioned in a pad region surrounding the inner region such that the first external connection terminals are not directly over the first pads and the first pads are not positioned in the inner region, and the second external connection terminals are positioned in an outer region surrounding the pad region such that the second external connection terminals are not directly over the first pads.

2. The wiring board according to claim 1, wherein the plurality of first external connection terminals are arranged in a lattice or a staggered pattern.

3. The wiring board according to claim 1, wherein the plurality of first external connection terminals are arranged in a dot array with a plurality of rows in a four-sided outline.

4. The wiring board according to claim 1, wherein the plurality of first external connection terminals are arranged in a dot array with one row in a four-sided outline.

5. The wiring board according to claim 1, wherein the minimum pitch between the first external connection terminals at least in a row in one direction is twice or more than twice the minimum pitch between the first pads of the electronic component.

6. The wiring board according to claim 1, wherein the substrate has an opening portion, the electronic component is positioned in the opening portion of the substrate, and the second external connection terminals are formed such that the second external connection terminals are positioned not directly over a clearance between the substrate and the electronic component in the opening portion of the substrate.

7. The wiring board according to claim 6, wherein the first laminated structure includes a layer comprising a resin, and the resin of the layer in the first laminated structure is filled in the clearance between the substrate and the electronic component in the opening portion of the substrate.

8. The wiring board according to claim 1, wherein the first external connection terminals are formed through an outer insulation layer in the first laminated structure, and the second external connection terminals are formed through the outer insulation layer in the first laminated structure.

9. The wiring board according to claim 1, wherein the first laminated structure includes an interlayer insulation layer and a conductive layer, and at least one of the first pads of the electronic component and the conductive layer in the first laminated structure are electrically connected by a via hole conductor formed in the interlayer insulation layer.

10. The wiring board according to claim 1, wherein the first laminated structure includes a plurality of interlayer insulation layers and a plurality of conductive layers, at least one of the first pads of the electronic component is electrically connected to one of the first and second external connection terminals by a plurality of via hole conductors formed in the interlayer insulation layers, the plurality of conductive layers includes a plurality of conductive patterns which extends from the pad region toward the outer region such that the second external connection terminals are positioned not directly over the first pads, and the plurality of conductive layers includes a plurality of conductive patterns which extends from the pad region toward the inner region such that the first external connection terminals are positioned not directly over the first pads.

11. The wiring board according to claim 10, wherein the plurality of conductive layers includes an outermost conductive layer including a plurality of conductive patterns which extends a longest distance among the conductive layers.

12. The wiring board according to claim 10, wherein the plurality of conductive layers includes an innermost conductive layer including a plurality of conductive patterns which extends a shortest distance among the conductive layers.

13. The wiring board according to claim 10, wherein each of the conductive layers includes a plurality of conductive patterns, and the conductive patterns of the conductive layers have lengths which become longer from an inner conductive layer toward an outer conductive layer in the conductive layers.

14. The wiring board according to claim 10, wherein each of the conductive layers includes a plurality of conductive patterns, and the conductive patterns of the conductive layers have lengths which become longer in stages from an inner conductive layer toward an outer conductive layer in the conductive layers.

15. The wiring board according to claim 10, wherein the via hole conductors are not positioned directly over one another in the interlayer insulation layers.

16. The wiring board according to claim 10, wherein the via hole conductors are formed in the interlayer insulation layers such that the first and second external connection terminals are not directly over the via hole conductors.

17. The wiring board according to claim 1, further comprising a first wiring board mounted to at least one of the plurality of first external connection terminals and the plurality of second external connection terminals.

18. The wiring board according to claim 17, further comprising:
   a plurality of external connection terminals formed on an opposite side of the substrate with respect to the first laminated structure; and
   a second wiring board mounted to the external connection terminals on the opposite side of the substrate with respect to the first laminated structure.

19. The wiring board according to claim 1, further comprising a second laminated structure formed on an opposite surface of the substrate with respect to the first laminated structure, wherein the second laminated structure has a third external connection terminal and a plurality of fourth external connection terminals formed on a surface of the second laminated structure, the electronic component has a plurality of second pads on an opposite side of the electronic component with respect to the first pads, the second pads are electronically connected to the third external connection terminal and the fourth external connection terminals, the third external connection terminal is positioned in the inner region, the second pads are positioned in the pad region such that the third external connection terminal is not directly over the second pads and the second pads are not positioned in the inner region, and the fourth external connection terminals are positioned in the outer region such that the fourth external connection terminals are not directly over the second pads.

20. The wiring board according to claim 1, wherein the electronic component has a redistribution layer.

* * * * *